US012406959B2

(12) United States Patent
Fountain, Jr. et al.

(10) Patent No.: US 12,406,959 B2
(45) Date of Patent: Sep. 2, 2025

(54) POST CMP PROCESSING FOR HYBRID BONDING

(71) Applicant: ADEIA SEMICONDUCTOR BONDING TECHNOLOGIES INC., San Jose, CA (US)

(72) Inventors: Gaius Gillman Fountain, Jr., Youngsville, NC (US); Guilian Gao, San Jose, CA (US); Chandrasekhar Mandalapu, Morrisville, NC (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 300 days.

(21) Appl. No.: 16/511,394

(22) Filed: Jul. 15, 2019

(65) Prior Publication Data

US 2020/0035641 A1    Jan. 30, 2020

Related U.S. Application Data

(60) Provisional application No. 62/703,727, filed on Jul. 26, 2018.

(51) Int. Cl.
 *H01L 23/00* (2006.01)
 *B81C 3/00* (2006.01)
 (Continued)

(52) U.S. Cl.
 CPC ............. *H01L 24/80* (2013.01); *B81C 3/001* (2013.01); *H01L 21/7684* (2013.01);
 (Continued)

(58) Field of Classification Search
 CPC ......... H01L 24/80; H01L 23/10; H01L 25/18; H01L 24/05; H01L 25/167;
 (Continued)

(56) References Cited

U.S. PATENT DOCUMENTS 5,341,979 A    8/1994 Gupta
5,753,536 A    5/1998 Sugiyama et al.
(Continued)

FOREIGN PATENT DOCUMENTS

CN    102456667 A    5/2012
CN    103681646       3/2014
(Continued)

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.
(Continued)

*Primary Examiner* — Ermias T Woldegeorgis
(74) *Attorney, Agent, or Firm* — Knobbe, Martens, Olson & Bear, LLP

(57) ABSTRACT

Devices and techniques include process steps for forming openings through stacked and bonded structures. The openings are formed by pre-etching through one or more layers of prepared dies after planarization of the bonding layer (by chemical-mechanical polishing (CMP) or the like) and prior to bonding. For instance, the openings are etched through one or more layers of dies to be bonded prior to bonding the dies to form an assembly.

20 Claims, 28 Drawing Sheets

(51) Int. Cl.
*H01L 21/768* (2006.01)
*H01L 21/78* (2006.01)
*H01L 23/055* (2006.01)
*H01L 23/10* (2006.01)
*H01L 23/522* (2006.01)
*H01L 23/58* (2006.01)
*H01L 25/00* (2006.01)
*H01L 25/065* (2023.01)
*H01L 25/16* (2023.01)
*H01L 25/18* (2023.01)
*H01L 21/02* (2006.01)
*H01L 23/367* (2006.01)
*H01L 23/48* (2006.01)
*H01L 23/552* (2006.01)

(52) U.S. Cl.
CPC ........ *H01L 21/76879* (2013.01); *H01L 21/78* (2013.01); *H01L 23/055* (2013.01); *H01L 23/10* (2013.01); *H01L 23/5226* (2013.01); *H01L 23/564* (2013.01); *H01L 23/585* (2013.01); *H01L 24/05* (2013.01); *H01L 24/08* (2013.01); *H01L 25/0657* (2013.01); *H01L 25/167* (2013.01); *H01L 25/18* (2013.01); *H01L 25/50* (2013.01); *B81B 2203/0315* (2013.01); *B81C 2203/0145* (2013.01); *B81C 2203/036* (2013.01); *H01L 21/02065* (2013.01); *H01L 21/02076* (2013.01); *H01L 21/76898* (2013.01); *H01L 23/367* (2013.01); *H01L 23/481* (2013.01); *H01L 23/552* (2013.01); *H01L 24/04* (2013.01); *H01L 2224/0401* (2013.01); *H01L 2224/04042* (2013.01); *H01L 2224/05571* (2013.01); *H01L 2224/08121* (2013.01); *H01L 2224/08147* (2013.01); *H01L 2224/80031* (2013.01); *H01L 2224/80357* (2013.01); *H01L 2224/80895* (2013.01); *H01L 2224/80896* (2013.01); *H01L 2225/06537* (2013.01); *H01L 2225/06541* (2013.01); *H01L 2225/06555* (2013.01); *H01L 2225/06565* (2013.01); *H01L 2225/06589* (2013.01); *H01L 2225/06596* (2013.01); *H01L 2924/1436* (2013.01); *H01L 2924/1461* (2013.01)

(58) Field of Classification Search
CPC ............. H01L 21/76879; H01L 23/055; H01L 23/5226; H01L 21/7684; H01L 24/08; H01L 25/50; H01L 23/585; H01L 23/564; H01L 21/78; H01L 25/0657; H01L 21/76898; H01L 2224/08147; H01L 2224/04042; H01L 21/02076; H01L 2924/1461; H01L 2224/05571; H01L 2224/80896; H01L 2225/06565; H01L 2224/80357; H01L 2924/1436; H01L 2225/06596; H01L 2224/0401; H01L 23/481; H01L 2224/80895; H01L 2224/08121; H01L 21/02065; H01L 24/04; H01L 2225/06541; H01L 23/367; H01L 23/552; H01L 2225/06537; H01L 2225/06555; H01L 2225/06589; H01L 2224/80031; H01L 2224/03831; H01L 2224/8034; H01L 2224/08237; H01L 2224/73201; H01L 2224/04073; H01L 2224/09517; H01L 2224/09519; H01L 2224/05647; H01L 2224/9202; H01L 2224/80006; H01L 2224/80345; H01L 2224/94; H01L 24/00; H01L 23/16; B81C 3/001; B81C 2203/0145; B81C 2203/036; B81C 1/00293; B81B 2203/0315
See application file for complete search history.

(56) References Cited

U.S. PATENT DOCUMENTS

| | | | |
|---|---|---|---|
| 5,771,555 | A | 6/1998 | Eda et al. |
| 6,080,640 | A | 6/2000 | Gardner et al. |
| 6,423,640 | B1 | 7/2002 | Lee et al. |
| 6,465,892 | B1 | 10/2002 | Suga |
| 6,887,769 | B2 | 5/2005 | Kellar et al. |
| 6,908,027 | B2 | 6/2005 | Tolchinsky et al. |
| 7,045,453 | B2 | 5/2006 | Canaperi et al. |
| 7,105,980 | B2 | 9/2006 | Abbott et al. |
| 7,193,423 | B1 | 3/2007 | Dalton et al. |
| 7,385,283 | B2 | 6/2008 | Wu et al. |
| 7,566,634 | B2 | 7/2009 | Beyne et al. |
| 7,750,488 | B2 | 7/2010 | Patti et al. |
| 7,790,578 | B2 | 9/2010 | Furui |
| 7,803,693 | B2 | 9/2010 | Trezza |
| 8,026,181 | B2 | 9/2011 | Arita et al. |
| 8,147,630 | B2 | 4/2012 | George |
| 8,183,127 | B2 | 5/2012 | Patti et al. |
| 8,349,635 | B1 | 1/2013 | Gan et al. |
| 8,377,798 | B2 | 2/2013 | Peng et al. |
| 8,441,131 | B2 | 5/2013 | Ryan |
| 8,461,673 | B2 | 6/2013 | Haba et al. |
| 8,476,165 | B2 | 7/2013 | Trickett et al. |
| 8,482,132 | B2 | 7/2013 | Yang et al. |
| 8,501,537 | B2 | 8/2013 | Sadaka et al. |
| 8,513,088 | B2 | 8/2013 | Yoshimura et al. |
| 8,513,810 | B2 | 8/2013 | Tago |
| 8,524,533 | B2 | 9/2013 | Tong et al. |
| 8,620,164 | B2 | 12/2013 | Heck et al. |
| 8,647,987 | B2 | 2/2014 | Yang et al. |
| 8,697,493 | B2 | 4/2014 | Sadaka |
| 8,716,105 | B2 | 5/2014 | Sadaka et al. |
| 8,802,538 | B1 | 8/2014 | Liu |
| 8,809,123 | B2 | 8/2014 | Liu et al. |
| 8,841,002 | B2 | 9/2014 | Tong |
| 8,860,229 | B1 | 10/2014 | Lin |
| 8,901,736 | B2 | 12/2014 | Shen et al. |
| 8,975,163 | B1 | 3/2015 | Lei et al. |
| 9,029,242 | B2 | 5/2015 | Holden et al. |
| 9,076,860 | B1 | 7/2015 | Lei et al. |
| 9,076,929 | B2 | 7/2015 | Katsuno et al. |
| 9,093,350 | B2 | 7/2015 | Endo et al. |
| 9,142,517 | B2 | 9/2015 | Liu |
| 9,171,756 | B2 | 10/2015 | Enquist et al. |
| 9,184,125 | B2 | 11/2015 | Enquist et al. |
| 9,224,704 | B2 | 12/2015 | Landru |
| 9,230,941 | B2 | 1/2016 | Chen et al. |
| 9,257,399 | B2 | 2/2016 | Kuang et al. |
| 9,299,736 | B2 | 3/2016 | Chen et al. |
| 9,312,229 | B2 | 4/2016 | Chen et al. |
| 9,331,149 | B2 | 5/2016 | Tong et al. |
| 9,337,235 | B2 | 5/2016 | Chen et al. |
| 9,373,527 | B2 | 6/2016 | Yu et al. |
| 9,385,024 | B2 | 7/2016 | Tong et al. |
| 9,391,143 | B2 | 7/2016 | Tong et al. |
| 9,394,161 | B2 | 7/2016 | Cheng et al. |
| 9,431,368 | B2 | 8/2016 | Enquist et al. |
| 9,437,572 | B2 | 9/2016 | Chen et al. |
| 9,443,796 | B2 | 9/2016 | Chou et al. |
| 9,461,007 | B2 | 10/2016 | Chun et al. |
| 9,496,239 | B1 | 11/2016 | Edelstein et al. |
| 9,524,959 | B1 | 12/2016 | Yeh et al. |
| 9,536,848 | B2 | 1/2017 | England et al. |
| 9,559,081 | B1 | 1/2017 | Lai et al. |
| 9,564,414 | B2 | 2/2017 | Enquist et al. |
| 9,589,905 | B2 | 3/2017 | Choi et al. |
| 9,620,481 | B2 | 4/2017 | Edelstein et al. |
| 9,656,852 | B2 | 5/2017 | Cheng et al. |
| 9,673,096 | B2 | 6/2017 | Hirschler et al. |
| 9,674,939 | B2 | 6/2017 | Scannell |
| 9,704,827 | B2 | 7/2017 | Huang et al. |

(56) References Cited

U.S. PATENT DOCUMENTS

| | | | |
|---|---|---|---|
| 9,716,033 B2 | 7/2017 | Enquist et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,748,206 B1* | 8/2017 | Huang | H01L 23/564 |
| 9,768,133 B1 | 9/2017 | Wu et al. | |
| 9,799,587 B2 | 10/2017 | Fujii et al. | |
| 9,852,988 B2 | 12/2017 | Enquist et al. | |
| 9,893,004 B2 | 2/2018 | Yazdani | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,036,734 B2 | 7/2018 | Fennell et al. | |
| 10,075,657 B2 | 9/2018 | Fahim et al. | |
| 10,204,893 B2 | 2/2019 | Uzoh et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,410,976 B2 | 9/2019 | Asano et al. | |
| 10,418,277 B2 | 9/2019 | Cheng et al. | |
| 10,434,749 B2 | 10/2019 | Tong | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,508,030 B2 | 12/2019 | Katkar et al. | |
| 10,522,499 B2 | 12/2019 | Enquist et al. | |
| 10,529,693 B2 | 1/2020 | Agarwal et al. | |
| 10,707,087 B2 | 7/2020 | Uzoh et al. | |
| 10,784,191 B2 | 9/2020 | Huang et al. | |
| 10,790,262 B2 | 9/2020 | Uzoh et al. | |
| 10,840,135 B2 | 11/2020 | Uzoh | |
| 10,840,205 B2 | 11/2020 | Fountain, Jr. et al. | |
| 10,854,578 B2 | 12/2020 | Morein | |
| 10,879,212 B2 | 12/2020 | Uzoh et al. | |
| 10,886,177 B2 | 1/2021 | DeLaCruz et al. | |
| 10,892,246 B2 | 1/2021 | Uzoh | |
| 10,923,408 B2 | 2/2021 | Huang et al. | |
| 10,923,413 B2 | 2/2021 | DeLaCruz | |
| 10,950,547 B2 | 3/2021 | Mohammed et al. | |
| 10,964,664 B2 | 3/2021 | Mandalapu et al. | |
| 10,985,133 B2 | 4/2021 | Uzoh | |
| 10,985,204 B2 | 4/2021 | Von Kanel | |
| 10,991,804 B2 | 4/2021 | DeLaCruz et al. | |
| 10,998,292 B2 | 5/2021 | Lee et al. | |
| 11,004,757 B2 | 5/2021 | Katkar et al. | |
| 11,011,494 B2 | 5/2021 | Gao et al. | |
| 11,011,503 B2 | 5/2021 | Wang et al. | |
| 11,031,285 B2 | 6/2021 | Katkar et al. | |
| 11,037,919 B2 | 6/2021 | Uzoh et al. | |
| 11,056,348 B2 | 7/2021 | Theil | |
| 11,056,390 B2 | 7/2021 | Uzoh et al. | |
| 11,069,734 B2 | 7/2021 | Katkar | |
| 11,088,099 B2 | 8/2021 | Katkar et al. | |
| 11,127,738 B2 | 9/2021 | DeLaCruz et al. | |
| 11,158,573 B2 | 10/2021 | Uzoh et al. | |
| 11,158,606 B2 | 10/2021 | Gao et al. | |
| 11,169,326 B2 | 11/2021 | Huang et al. | |
| 11,171,117 B2 | 11/2021 | Gao et al. | |
| 11,176,450 B2 | 11/2021 | Teig et al. | |
| 11,195,748 B2 | 12/2021 | Uzoh et al. | |
| 11,205,625 B2 | 12/2021 | DeLaCruz et al. | |
| 11,222,863 B2 | 1/2022 | Hua et al. | |
| 11,244,920 B2 | 2/2022 | Uzoh | |
| 11,256,004 B2 | 2/2022 | Haba et al. | |
| 11,264,357 B1 | 3/2022 | DeLaCruz et al. | |
| 11,276,676 B2 | 3/2022 | Enquist et al. | |
| 11,296,044 B2 | 4/2022 | Gao et al. | |
| 11,296,053 B2 | 4/2022 | Uzoh et al. | |
| 11,329,034 B2 | 5/2022 | Tao et al. | |
| 11,348,898 B2 | 5/2022 | DeLaCruz et al. | |
| 11,355,404 B2 | 6/2022 | Gao et al. | |
| 11,355,443 B2 | 6/2022 | Huang et al. | |
| 11,367,652 B2 | 6/2022 | Uzoh et al. | |
| 11,373,963 B2 | 6/2022 | DeLaCruz et al. | |
| 11,380,597 B2 | 7/2022 | Katkar et al. | |
| 11,385,278 B2 | 7/2022 | DeLaCruz et al. | |
| 11,387,202 B2 | 7/2022 | Haba et al. | |
| 11,387,214 B2 | 7/2022 | Wang et al. | |
| 11,393,779 B2 | 7/2022 | Gao et al. | |
| 11,437,423 B2 | 9/2022 | Takachi | |
| 11,462,419 B2 | 10/2022 | Haba | |
| 11,476,213 B2 | 10/2022 | Haba et al. | |
| 11,515,291 B2 | 11/2022 | DeLaCruz et al. | |
| 11,626,363 B2 | 4/2023 | Haba et al. | |
| 11,631,647 B2 | 4/2023 | Haba | |
| 11,652,083 B2 | 5/2023 | Uzoh et al. | |
| 11,664,357 B2 | 5/2023 | Fountain, Jr. et al. | |
| 11,721,653 B2 | 8/2023 | DeLaCruz et al. | |
| 11,728,273 B2 | 8/2023 | Haba | |
| 11,735,523 B2 | 8/2023 | Uzoh | |
| 11,742,314 B2 | 8/2023 | Uzoh et al. | |
| 11,749,645 B2 | 9/2023 | Gao et al. | |
| 11,762,200 B2 | 9/2023 | Katkar et al. | |
| 11,764,177 B2 | 9/2023 | Haba | |
| 11,842,894 B2 | 12/2023 | Katkar et al. | |
| 11,876,076 B2 | 1/2024 | DeLaCruz et al. | |
| 11,967,575 B2 | 4/2024 | Gao et al. | |
| 12,051,621 B2 | 7/2024 | Uzoh et al. | |
| 12,068,278 B2 | 8/2024 | Uzoh et al. | |
| 2002/0003307 A1 | 1/2002 | Suga | |
| 2003/0071106 A1 | 4/2003 | Bendat et al. | |
| 2003/0148591 A1 | 8/2003 | Guo et al. | |
| 2004/0084414 A1 | 5/2004 | Sakai et al. | |
| 2005/0101130 A1 | 5/2005 | Lopatin et al. | |
| 2005/0161795 A1 | 7/2005 | Tong et al. | |
| 2005/0161808 A1 | 7/2005 | Anderson | |
| 2006/0057945 A1 | 3/2006 | Hsu et al. | |
| 2006/0278996 A1* | 12/2006 | Trezza | H01L 24/05 257/777 |
| 2007/0111386 A1 | 5/2007 | Kim et al. | |
| 2007/0123061 A1 | 5/2007 | Evertsen et al. | |
| 2007/0148912 A1 | 6/2007 | Morita et al. | |
| 2007/0181991 A1 | 8/2007 | Ishino et al. | |
| 2007/0262468 A1 | 11/2007 | Nasu et al. | |
| 2008/0006938 A1 | 1/2008 | Patti et al. | |
| 2008/0064189 A1 | 3/2008 | Daubenspeck et al. | |
| 2008/0237310 A1 | 10/2008 | Periaman et al. | |
| 2008/0268614 A1 | 10/2008 | Yang et al. | |
| 2008/0315333 A1 | 12/2008 | Combi et al. | |
| 2009/0029274 A1 | 1/2009 | Olson et al. | |
| 2009/0095399 A1 | 4/2009 | Zussy et al. | |
| 2010/0096699 A1 | 4/2010 | Miyata | |
| 2011/0084403 A1 | 4/2011 | Yang et al. | |
| 2011/0272798 A1 | 11/2011 | Lee et al. | |
| 2011/0308738 A1 | 12/2011 | Maki et al. | |
| 2012/0068355 A1 | 3/2012 | Aoki et al. | |
| 2012/0119258 A1 | 5/2012 | Liang | |
| 2012/0238070 A1 | 9/2012 | Libbert et al. | |
| 2013/0009321 A1 | 1/2013 | Kagawa et al. | |
| 2014/0015088 A1 | 1/2014 | Chapelon | |
| 2014/0145338 A1 | 5/2014 | Fujii et al. | |
| 2014/0175655 A1 | 6/2014 | Chen et al. | |
| 2014/0187040 A1 | 7/2014 | Enquist et al. | |
| 2014/0264948 A1 | 9/2014 | Chou et al. | |
| 2014/0319656 A1 | 10/2014 | Marchena et al. | |
| 2015/0021789 A1* | 1/2015 | Lin | H01L 24/80 438/118 |
| 2015/0031189 A1 | 1/2015 | Chen et al. | |
| 2015/0064498 A1 | 3/2015 | Tong | |
| 2015/0116968 A1 | 4/2015 | Yamada et al. | |
| 2015/0145140 A1 | 5/2015 | Haba et al. | |
| 2015/0364434 A1 | 12/2015 | Chen et al. | |
| 2016/0013099 A1 | 1/2016 | Tanida et al. | |
| 2016/0071770 A1 | 3/2016 | Albermann et al. | |
| 2016/0181228 A1 | 6/2016 | Higuchi et al. | |
| 2016/0197055 A1 | 7/2016 | Yu et al. | |
| 2016/0233175 A1 | 8/2016 | Dubey et al. | |
| 2016/0233264 A1* | 8/2016 | Kagawa | H01L 24/08 |
| 2016/0343682 A1 | 11/2016 | Kawasaki | |
| 2016/0343762 A1 | 11/2016 | Kagawa et al. | |

(56) References Cited

U.S. PATENT DOCUMENTS

| | | |
|---|---|---|
| 2017/0154768 A1 | 6/2017 | Zhao |
| 2017/0200756 A1 | 7/2017 | Kao et al. |
| 2017/0221950 A1* | 8/2017 | Ho .................. H10F 39/809 |
| 2017/0250172 A1 | 8/2017 | Huang et al. |
| 2018/0005940 A1* | 1/2018 | Chen .................. H01L 23/5226 |
| 2018/0005977 A1 | 1/2018 | Lin |
| 2018/0040511 A1 | 2/2018 | Kamineni et al. |
| 2018/0068984 A1 | 3/2018 | Beyne et al. |
| 2018/0102286 A1 | 4/2018 | Uzoh et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0226371 A1 | 8/2018 | Enquist |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0088527 A1 | 3/2019 | Uzoh |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0148336 A1 | 5/2019 | Chen et al. |
| 2019/0152773 A1 | 5/2019 | Herbsommer et al. |
| 2019/0198409 A1 | 6/2019 | Katkar et al. |
| 2019/0214424 A1 | 7/2019 | Borthakur et al. |
| 2019/0265411 A1 | 8/2019 | Huang et al. |
| 2019/0333550 A1 | 10/2019 | Fisch |
| 2019/0355637 A1 | 11/2019 | Chen et al. |
| 2019/0371763 A1 | 12/2019 | Agarwal et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0043910 A1 | 2/2020 | Uzoh et al. |
| 2020/0058617 A1 | 2/2020 | Wu et al. |
| 2020/0075520 A1 | 3/2020 | Gao et al. |
| 2020/0075533 A1 | 3/2020 | Gao et al. |
| 2020/0075534 A1 | 3/2020 | Gao et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395304 A1 | 12/2020 | Chen et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0118849 A1 | 4/2021 | Limaye et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285213 A1 | 9/2022 | Uzoh et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187398 A1 | 6/2023 | Gao et al. |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0282610 A1 | 9/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman et al. |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |
| 2024/0387419 A1 | 11/2024 | Mrozek et al. |
| 2024/0404990 A1 | 12/2024 | Uzoh et al. |
| 2025/0004197 A1 | 1/2025 | Haba et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |

(56) References Cited

U.S. PATENT DOCUMENTS

| | | | |
|---|---|---|---|
| 2025/0054854 | A1 | 2/2025 | Katkar et al. |
| 2025/0079364 | A1 | 3/2025 | Uzoh et al. |
| 2025/0096191 | A1 | 3/2025 | Gao et al. |

FOREIGN PATENT DOCUMENTS

| | | |
|---|---|---|
| CN | 104051288 A | 9/2014 |
| CN | 104282577 A | 1/2015 |
| EP | 2 339 614 A1 | 6/2011 |
| EP | 2 685 491 A2 | 1/2014 |
| JP | 04-337694 | 11/1992 |
| JP | 2000-100679 | 4/2000 |
| JP | 2001-102479 | 4/2001 |
| JP | 2002-353416 | 12/2002 |
| JP | 2004-193493 | 7/2004 |
| JP | 2009-135348 | 6/2009 |
| JP | 2010-073964 | 4/2010 |
| JP | 2013-33786 A | 2/2013 |
| JP | 2017-130610 | 7/2017 |
| JP | 2018-160519 A | 10/2018 |
| KR | 10-0386954 B1 | 6/2003 |
| KR | 10-2004-0020827 | 3/2004 |
| KR | 10-0871381 B1 | 12/2008 |
| KR | 10-2015-0097798 | 8/2015 |
| TW | 201510555 A | 3/2015 |
| TW | 201519477 A | 5/2015 |
| WO | 2005-043584 A2 | 5/2005 |
| WO | WO 2009/005898 A1 | 1/2009 |
| WO | WO 2010/024678 A1 | 3/2010 |
| WO | WO 2014/052445 A1 | 4/2014 |
| WO | WO 2015/134227 A1 | 9/2015 |
| WO | WO 2017/151442 A1 | 9/2017 |

OTHER PUBLICATIONS

Moriceau, H. et al., "Overview of Recent Direct Wafer Bonding Advances and Applications", Advances in Natural Sciences-Nanoscience and Nanotechnology, 2010, 12 pages.
Nakanishi, H. et al., "Studies on SiO2—SiO2 Bonding with Hydrofluoric Acid. Room Temperature and Low Stress Bonding Technique for MEMS," Tech. Research Lab., 200, Elsevier Science S.A., 8 pages.
Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(I), 6 pages.
Plobi et al., "Wafer Direct Bonding: Tailoring Adhesion Between Brittle Materials," Materials Science and Engineering Review Journal, 1999, 88 pages.
International Search Report and Written Opinion for PCT/US2019/042050, dated Oct. 3, 20191, 14 pages.
Clarke, Peter, "Backside of the wafer promised 3D chip improvements," May 20, 2019, https://www.eenewsanalog.com/news/backside-wafer-promises-3d-chip-improvements, downloaded Jul. 5, 2021. 3 pages.
Peters, Laura, "Challenges in backside power delivery," https://semiengineering.com/challenges-in-backside-power-delivery, Nov. 17, 2022 (printed Nov. 23, 2022), 14 pages.
Bush, Steve, "Electronica: Automotive power modules from on Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).
Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.
Onsemi AR0820 image, cross section of a CMOS image sensor product. The part in the image was shipped on Sep. 16, 2021. Applicant makes no representation that the part in the image is identical to the part identified in the separately submitted reference Bush, Nov. 8, 2018, Electronics Weekly.com ("Bush article"); however, the imaged part and the part shown in the Bush article share the part number "Onsemi AR0820."
Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."
"Die-to-Wafer Fusion and Hybrid Bonding," EV Group, https://www.evgroup.com/technologies/die-to-wafer-fusion-and-hybrid-bonding/, printed Sep. 21, 2022, 8 pages.
"Photo Etching DBC for Power Circuits—Direct Bond Copper (DBC) on Ceramic Used for Power Circuits," Conard Corporation, 2021, downloaded Nov. 9, 2021, https://www.conardcorp.com/photo-etching-dbc-for-power-circuits/, 2 pages.
"The effects of edge trimming—Engineering R&D Division, Operation V," Disco Technical Review Mar. 2016, 3 pages.
"Lecture 29: Productivity and process yield," National Programme on Technology Enhanced Learning (NPTEL), MM5017: Electronic materials, devices, and fabrication, 16 pages.
Amirfeiz et al., "Formation of silicon structures by plasma-activated wafer bonding," Journal of The Electrochemical Society, 2000, vol. 147, No. 7, pp. 2693-2698.
Ceramic Microstructures: Control at the Atomic Level, Recent Progress in Surface Activated Bonding, Abstract, 1998, pp. 385-389.
Chang, T.C. et al., "A method for fabricating a superior oxide/nitride/oxide gate stack," Electrochemical and Solid-State Letters, 2004, vol. 7, No. 7, pp. G138-G140.
Chinese Office Action dated Sep. 26, 2023 with Search Report, Chinese Application No. 201980064165.6, 8 pages.
Chung et al., "Room temperature GaAs—Si and InP—Si wafer direct bonding by the surface activate bonding method," Abstract, Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Abstract, Applied Surface Science, Jun. 2, 1997, vols. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Frumusanu, Andrei, "TSMC's version of EMIB is 'LSI': Currently in pre-qualification," AnandTech, https://www.anandtech.com/show/16031/tsmcs-version-of-emib-lsi-3dfabric, Aug. 25, 2020, 6 pages.
Fukushima, Takafumi et al., "Oxide-oxide thermocompression direct bonding technologies with capillary self-assembly for multichip-to-wafer heterogeneous 3D system integration," Micromachines, Oct. 2016, vol. 7, No. 184, pp. 18 pages.
Gao, G. et al., "Low temperature hybrid bonding for die to wafer stacking applications," 2021 IEEE 71st Electronic Components and Technology Conference (ECTC), IEEE, Jun. 1, 2021-Jul. 4, 2021.
Gösele et al., "Semiconductor Wafer Bonding: A flexible approach to materials combinations in microelectronics; micromechanics and optoelectronics," IEEE, 1997, pp. 23-32.
Hooper, A. et al. "Review of wafer dicing techniques for via-middle process 3DI/TSV ultrathin silicon device wafers," 2015 IEEE 65th Electronic Components and Technology Conference (ECTC).
Hosoda et al., "Effect of the surface treatment on the room-temperature bonding of Al to Si and SiO2," Abstract, Journal of Materials Science, Jan. 1, 1998, vol. 33, Issue 1, pp. 253-258.

(56) References Cited

OTHER PUBLICATIONS

Hosoda et al., "Room temperature GaAs—Si and InP—Si wafer direct bonding by the surface activated bonding method," Abstract, Nuclear Inst. And Methods in Physics Research B, 1997, vol. 121, Nos. 1-4, pp. 203-206.
Howlader et al., "A novel method for bonding of ionic wafers," Abstract, Electronics Components and Technology Conference, 2006, IEEE, pp. 7—pp.
Howlader et al., "Bonding of p—Si/n—InP wafers through surface activated bonding method at room temperature," Abstract, Indium Phosphide and Related Materials, 2001, IEEE International Conference on, pp. 272-275.
Howlader et al., "Characterization of the bonding strength and interface current of p—Si/ n—InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p—SionGaAs wafers bonded by surface activated bonding at room temperature," J. Vac. Sci. Technol. B 19, Nov./Dec. 2001, pp. 2114-2118.
Itoh et al., "Characteristics of fritting contacts utilized for micromachined wafer probe cards," Abstract, 2000 American Institute of Physics, AIP Review of Scientific Instruments, vol. 71, 2000, pp. 2224.
Itoh et al., "Characteristics of low force contact process for MEMS probe cards," Abstract, Sensors and Actuators A: Physical, Apr. 1, 2002, vols. 97-98, pp. 462-467.
Itoh et al., "Development of MEMS IC probe card utilizing fritting contact," Abstract, Initiatives of Precision Engineering at the Beginning of a Millennium: 10th International Conference on Precision Engineering (ICPE) Jul. 18-20, 2001, Yokohama, Japan, 2002, Book Part 1, pp. 314-318.
Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Jin, H. et al., "Silicon / Silicon Oxide / LPCVD Silicon Nitride Stacks: The Effect of Oxide Thickness on Bulk Damage and Surface Passivation," Centre for Sustainable Energy Systems, Faculty of Engineering and Information Technology, The Australian National University, Canberra ACT 0200, Australia, 3 pages.
Kim et al., "Low temperature direct Cu—Cu bonding with low energy ion activation method," Abstract, Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Abstract, Proceedings—Electrochemical Society, 2003, vol. 19, pp. 239-247.
Lei, W.S. et al., "Die singulation technologies for advanced packaging: A critical review," J. Vac. Sci. Technol. B 30(4), Apr. 6, 2012, Jul./Aug. 1012, pp. 040801-1-040801-27.
Leissa, A.W., "Vibration of Plates," NASA SP-160, 1969, 362 pages.
Lim, K. et al., "Design and simulation of symmetric wafer-to-wafer bonding compensating a gravity effect," 2020 IEEE 70th Electronic Components and Technology Conference (ECTC), doi: 10.1109/ECTC32862.2020.00234 (2020), 6 pages.
Marinov, Val et al., "Laser-enabled advanced packaging of ultrathin bare dice in flexible substrates," IEEE Transactions on Components, Packaging and Manufacturing Technology, Apr. 2012, vol. 2, No. 4, pp. 569-577.
Matsuzawa et al., "Room-temperature interconnection of electroplated Au microbump by means of surface activated bonding method," Abstract, Electronic Components and Technology Conference, 2001, 51st Proceedings, IEEE, pp. 384-387.
NASA SBIR/STTR Technologies, Proposal No. 09-1 S5.05-9060—Reliable Direct Bond Copper Ceramic Packages for High Temperature Power Electronics, Contract No. NNX10CE23P, PI: Ender Savrun, PhD, Sienna Technologies, Inc.—Woodinville, WA, 1 page.
Onodera et al., "The effect of prebonding heat treatment on the separability of Au wire from Ag—plated Cu alloy substrate," Abstract, Electronics Packaging Manufacturing, IEEE Transactions, Jan. 2002, vol. 25, Issue 1, pp. 5-12.
Reiche et al., "The effect of a plasma pretreatment on the Si/Si bonding behaviour," Electrochemical Society Proceedings, 1998, vol. 97-36, pp. 437-444.
Roberds et al., "Low temperature , in situ, plasma activated wafer bonding," Electrochemical Society Proceedings, 1997, vol. 97-36, pp. 598-606.
Shigetou et al., "Room temperature bonding of ultra-fine pitch and low-profiled Cu electrodes for bump-less interconnect," Abstract, 2003 Electronic Components and Technology Conference, pp. 848-852.
Shigetou et al., "Room-temperature direct bonding of CMP—Cu film for bumpless interconnection," Abstract, Electronic Components and Technology Conference, 51st Proceedings, 2001, IEEE, pp. 755-760.
Shingo et al., "Design and fabrication of an electrostatically actuated MEMS probe card," Abstract, Transducers, Solid-State Sensors, Actuators and Microsystems, 12th International Conference, Jun. 8-12, 2003, vol. 2, pp. 1522-1525.
Sony IMX260 images, showing various cross sections and materials analyses for a hybrid bonded back side illuminated CMOS image sensor. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image." (8 pages).
Suga et al., "A new approach to Cu—Cu direct bump bonding," Abstract, IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Abstract, Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Abstract, Electronic Components and Technology Conference, 2001, IEEE, pp. 1013-1018.
Suga et al., "Bump-less interconnect for next generation system packaging," Abstract, Electronic Components and Technology Conference, 2001, IEEE, pp. 1003-1008.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Abstract, Electronic Components and Technology Conference, 2002, IEEE, pp. 105-111.
Suga, "UHV room temperature joining by the surface activated bonding method," Abstract, Advances in science and technology, Techna, Faenza, Italie, 1999, pp. C1079-C1089.
Suga, T., "Feasibility of surface activated bonding for ultra-fine pitch interconnection—A new concept of bump-less direct bonding for system level packaging," Abstract, The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Takagi et al., "Wafer-scale room-temperature bonding between silicon and ceramic wafers by means of argon-beam surface activation," Abstract, Micro Electro Mechanical Systems, 2001, MEMS 2001, The 14th IEEE International Conference, Jan. 25, 2001, IEEE, pp. 60-63.
Takagi et al., "Effect of surface roughness on room-temperature wafer bonding by Ar beam surface activation," Japanese Journal of Applied Physics, 1998, vol. 37, Part 1, No. 1, pp. 4197-4203.

(56) References Cited

OTHER PUBLICATIONS

Takagi et al., "Low temperature direct bonding of silicon and silicon dioxide by the surfacelactivation method," Abstract, Solid State Sensors and Actuators, 1997, Transducers '97 Chicago, 1997 International Conference, vol. 1, pp. 657-660.
Takagi et al., "Room temperature silicon wafer direct bonding in vacuum by Ar beam irradiation," Abstract, Micro Electro Mechanical Systems, MEMS '97 Proceedings, 1997, IEEE, pp. 191-196.
Takagi et al., "Room-temperature bonding of lithium niobate and silicon wafers by argon-beam surface activation," Abstract, Appl. Phys. Lett., 1999. vol. 74, pp. 2387.
Takagi et al., "Room-temperature wafer bonding of Si to LiNbO3, LiTaO3 and Gd3Ga5O12 by Ar—beam surface activation," Abstract, Journal of Micromechanics and Microengineering, 2001, vol. 11, No. 4, pp. 348.
Takagi et al., "Room-temperature wafer bonding of silicon and lithium niobate by means of arbon-beam surface activation," Abstract, Integrated Ferroelectrics: An International Journal, 2002, vol. 50, Issue 1, pp. 53-59.
Takagi et al., "Surface activated bonding silicon wafers at room temperature," Abstract, Appl. Phys. Lett. 68, 2222 (1996).
Takagi et al., "Wafer-scale spontaneous bonding of silicon wafers by argon-beam surface activation at room temperature," Abstract, Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.

Topol et al., "Enabling technologies for wafer-level bonding of 3D MEMS and integrated circuit structures," 2004 Electronics Components and Technology Conference, 2004 IEEE, pp. 931-938.
Uhrmann, T. et al., "Heterogeneous integration by collective die-to-wafer bonding," Chip Scale Review, Nov./Dec. 2018, vol. 22, No. 6, pp. 10-12.
Urteaga, M. et al., "THz bandwidth InP HBT technologies and heterogeneous integration with Si CMOS," 2016 IEEE Bipolar/BiCMOS Circuits and Technology Meeting (BCTM), 2016, pp. 35-41, doi: 10.1109/BCTM.2016.7738973.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Abstract, Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Abstract, Electronic Packaging Technology Proceedings, Oct. 28-30, 2003, Shanghai, China, pp. 479-483.
Zgheib, Elia et al., "Multilayered models for determining the Young's modulus of thin films by means of Impulse Excitation Technique," https://www.sciencedirect.com/science/article/pii/S0167663619304752,Manuscript_68d36734cad5d1ad97e7c65bfb45f5d1, 2019, 39 pages.

\* cited by examiner

POST CMP PROCESSING FOR HYBRID BONDING

PRIORITY CLAIM AND CROSS-REFERENCE TO RELATED APPLICATION

This application claims the benefit under 35 U.S.C. § 119(e)(1) of U.S. Provisional Application No. 62/703,727, filed Jul. 26, 2018, which is hereby incorporated by reference in its entirety.

FIELD

The following description relates to integrated circuits ("ICs"). More particularly, the following description relates to manufacturing IC dies and wafers.

BACKGROUND

Microelectronic elements often comprise a thin slab of a semiconductor material, such as silicon or gallium arsenide, commonly called a semiconductor wafer. A wafer can be formed to include multiple integrated chips or dies on a surface of the wafer and/or partly embedded within the wafer. Dies that are separated from a wafer are commonly provided as individual, prepackaged units. In some package designs, the die is mounted to a substrate or a chip carrier, which is in turn mounted on a circuit panel, such as a printed circuit board (PCB). For example, many dies are provided in packages suitable for surface mounting.

Packaged semiconductor dies can also be provided in "stacked" arrangements, wherein one package is provided, for example, on a circuit board or other carrier, and another package is mounted on top of the first package. These arrangements can allow a number of different dies or devices to be mounted within a single footprint on a circuit board and can further facilitate high-speed operation by providing a short interconnection between the packages. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package).

Additionally, dies or wafers may be stacked in a three-dimensional arrangement as part of various microelectronic packaging schemes. This can include stacking a layer of one or more dies, devices, and/or wafers on a larger base die, device, wafer, substrate, or the like, stacking multiple dies or wafers in a vertical or horizontal arrangement, and various combinations of both.

Dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company (see for example, U.S. Pat. Nos. 6,864,585 and 7,485,968, which are incorporated herein in their entirety). Respective mating surfaces of the bonded dies or wafers often include embedded conductive interconnect structures, or the like. In some examples, the bonding surfaces are arranged and aligned so that the conductive interconnect structures from the respective surfaces are joined during the bonding. The joined interconnect structures form continuous conductive interconnects (for signals, power, etc.) between the stacked dies or wafers.

There can be a variety of challenges to implementing stacked die and wafer arrangements. When bonding stacked dies using a direct bonding or hybrid bonding technique, it is usually desirable that the surfaces of the dies to be bonded be extremely flat, smooth, and clean. For instance, in general, the surfaces should have a very low variance in surface topology (i.e., nanometer scale variance), so that the surfaces can be closely mated to form a lasting bond.

Conductive interconnect structures at the bonding surfaces may be slightly recessed, just below the insulating material of the bonding surface. The amount of recess below the bonding surface may be determined by a dimensional tolerance, specification, or physical limitation of the device or application. The hybrid surface may be prepared for bonding with another die, wafer, or other substrate using a chemical mechanical polishing (CMP) process, or the like.

Additionally, in some applications it is desired to form wirebond pads, testing pads, and other structures on or beside a bonding surface, or within cavities at the bonding surface, to be accessed, often from outside of the stacked and bonded device, after bonding. Openings or cavities may be used to create access ports for sensor applications, physical and electrical access (e.g., for wirebonding, testing, electrical connections, etc.), low-impedance, low-loss connections, air bridges, and so forth. Forming cavities to accommodate these structures, connections, accesses, and for other purposes, through stacked and bonded dies, wafers, and substrates can be problematic, particularly when the cavities desired are to have a fine pitch and/or a significant depth.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternatively, other implementations of devices and/or systems may include additional components, or various combinations of the described components, and remain within the scope of the disclosure.

SUMMARY

Figure 1:
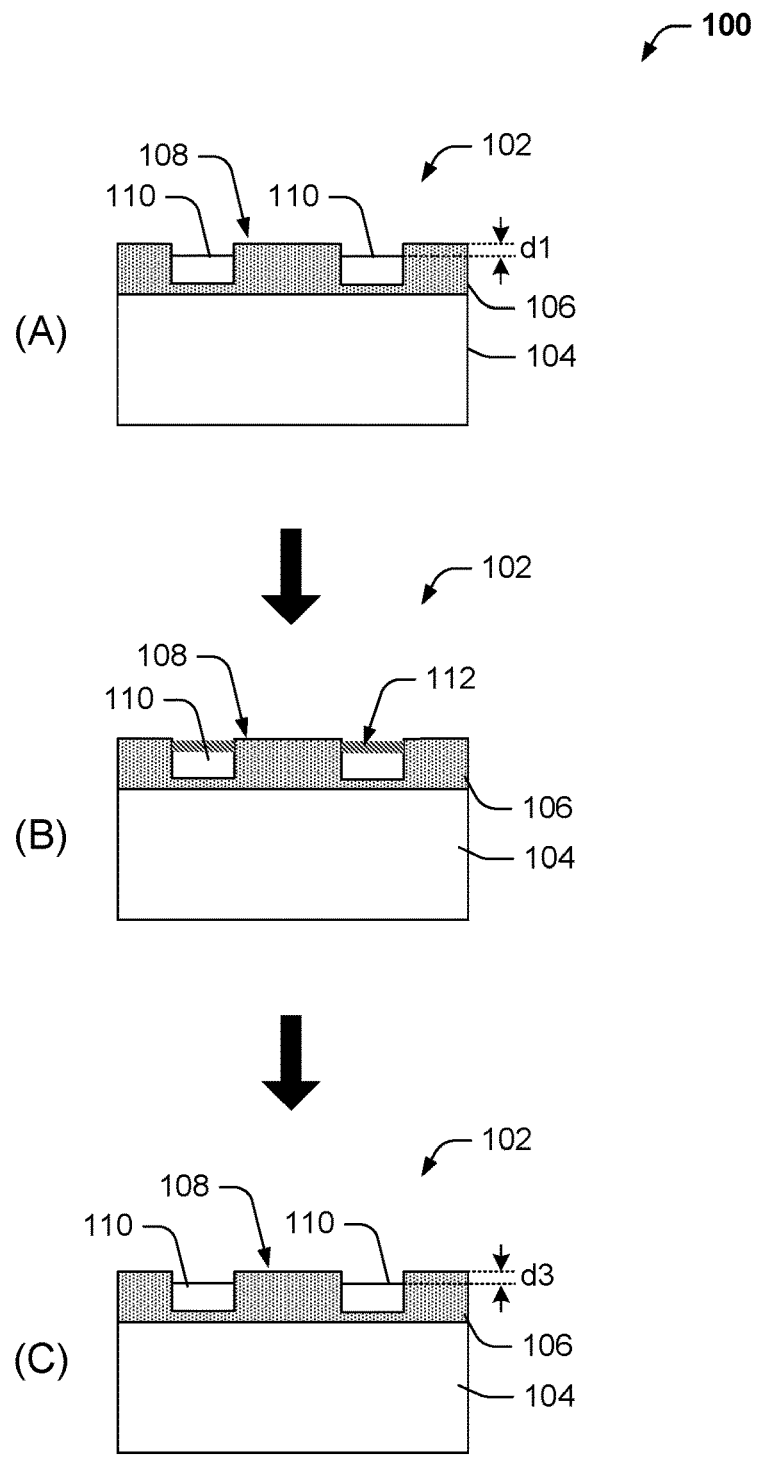
FIGS. 1 and 2 show example graphical flow diagrams illustrating example processes for preparing a bonding surface, according to an embodiment.

Representative techniques and devices are disclosed, including process steps for forming holes, cavities, openings, recesses, and the like (hereinafter "openings") through stacked and bonded structures. Of particular interest are intimately bonded structures, formed using direct bonding and hybrid bonding techniques without adhesive, as discussed above. In various embodiments, the openings are formed by pre-etching through one or more layers of prepared wafers or dies after planarization of the bonding layer (by chemical-mechanical polishing (CMP) or the like) and prior to bonding. For instance, the openings are etched through one or more layers of dies to be bonded prior to bonding the dies to form an assembly.

In various implementations, a microelectronic assembly comprises a first substrate having a bonding surface with a planarized topography of inorganic dielectric material or insulator, and a first plurality of electrically conductive features embedded in the dielectric layer with one surface exposed at the bonding surface of the first substrate, and a second substrate having a bonding surface with a planarized topography of inorganic dielectric material or insulator, bonded to the bonding surface of the first substrate. The second substrate includes a second plurality of electrically conductive features embedded in the dielectric layer with one surface exposed at the bonding surface of the second substrate, bonded to the first plurality of electrically conductive features. The first and second pluralities of electrically conductive features are direct-bonded, for instance, using a hybrid bonding technique or the like, without the use of solder or other added bonding materials. The use of the term "conductive features" will be used herein to specifically refer to these direct-bond conductive features.

One or more electrically conductive contact pads, separate from the direct-bond electrically conductive features, are disposed within an insulating layer of the second substrate and below the bonding surface of the second substrate. The one or more electrically conductive contact pads may be disposed outside or inside a perimeter of the first plurality of electrically conductive features and the second plurality of electrically conductive features or in one or more designated areas. The electrically conductive contact pads may include any conductive structure other than the electrically conductive features, which may be used as conductive interconnects for wirebonds, terminals, test pads, ball grids, and so forth.

Where the "conductive features" of one die or wafer may have matching or mating conductive features on a second direct-bonded die or wafer, the "contact pads" are unmatched for the purposes of die-to-die, wafer-to-wafer, or die-to-wafer direct bonding. For example, the contact pads of one die or wafer generally do not have a mating contact pad to be directly bonded to on the second bonded die or wafer. Further, the contact pads are generally on a different (e.g., "lower") layer of a die or wafer than the conductive features, and may be disposed or buried below the bonding surface of the die or wafer.

In an implementation, the microelectronic assembly further comprises one or more secondary openings in the insulating layer of the second substrate aligned to the one or more electrically conductive contact pads. The one or more secondary openings extend from the bonding surface of the second substrate to the one or more electrically conductive contact pads, providing access to the one or more electrically conductive contact pads.

In another implementation, the microelectronic assembly further comprises one or more primary openings in an insulating layer of the first substrate, aligned to the one or more secondary openings and to the electrically conductive contact pads. The one or more primary openings extend to the one or more secondary openings, providing access to the one or more electrically conductive contact pads.

In another implementation, the microelectronic assembly further comprises one or more tertiary openings in a base layer of the first substrate, aligned to the one or more primary openings in the insulating layer of the first substrate and to the electrically conductive contact pads. The one or more tertiary openings extend from an outside surface of the first substrate to the one or more primary openings, providing access to the one or more electrically conductive contact pads from beyond the outside surface of the first substrate.

In an embodiment, the microelectronic assembly comprises one or more electrically conductive structures disposed within one or more of the one or more secondary openings, the one or more primary openings, and the one or more tertiary openings, and electrically coupled to the one or more electrically conductive contact pads.

In another implementation, a microelectronic assembly comprises a first substrate having a bonding surface with a planarized topography, having a first plurality of electrically conductive features at the bonding surface of the first substrate, and a second substrate having a bonding surface with a planarized topography, bonded to the bonding surface of the first substrate. A second plurality of electrically conductive features is disposed at the bonding surface of the second substrate and bonded to the first plurality of electrically conductive features while misaligned to the first plurality of electrically conductive features by a first extent. One or more electrically conductive contact pads is disposed within an insulating layer of the second substrate and below the bonding surface of the second substrate. The one or more electrically conductive contact pads is disposed either outside a perimeter of the first plurality of electrically conductive features and the second plurality of electrically conductive features or in one or more designated areas. One or more secondary openings in the insulating layer of the second substrate is aligned to the one or more electrically conductive contact pads, and the one or more secondary openings extend from the bonding surface of the second substrate to the one or more electrically conductive contact pads. One or more primary openings in an insulating layer of the first substrate are misaligned to the one or more secondary openings by the first extent, and the one or more primary openings extend to the one or more secondary openings and provide access to the one or more electrically conductive contact pads.

In additional implementations, a microelectronic assembly comprises a first substrate having a hybrid bonding surface comprising an insulator material with one or more metallic features therein, and a planarized topography, and a second substrate having a hybrid bonding surface comprising an insulator material with one or more metallic features embedded therein, having a planarized topography, and bonded to the hybrid bonding surface of the first substrate. The one or more metallic features of the second substrate are bonded to the one or more metallic features of the first substrate. A cavity is disposed at a bond joint between the first substrate and the second substrate where the hybrid bonding surface of the first substrate and the hybrid bonding surface of the second substrate make contact. The cavity is formed at least by a recess in the hybrid bonding layer of the first substrate. A continuous seal is formed by the one or more metallic features of the first substrate and the one or more metallic features of the second substrate, and is disposed around a periphery of the cavity at the bond joint.

Various implementations and arrangements are discussed with reference to electrical and electronics components and varied carriers. While specific components (i.e., dies, wafers, integrated circuit (IC) chip dies, substrates, etc.) are mentioned, this is not intended to be limiting, and is for ease of discussion and illustrative convenience. The techniques and devices discussed with reference to a wafer, die, substrate, or the like, are applicable to any type or number of electrical components, circuits (e.g., integrated circuits (IC), mixed circuits, ASICS, memory devices, processors, etc.), groups of components, packaged components, structures (e.g., wafers, panels, boards, PCBs, etc.), and the like, that may be coupled to interface with each other, with external circuits, systems, carriers, and the like. Each of these different components, circuits, groups, packages, structures, and the like, can be generically referred to as a "microelectronic component." For simplicity, unless otherwise specified, components being bonded to another component will be referred to herein as a "die."

This summary is not intended to give a full description. Implementations are explained in more detail below using a plurality of examples. Although various implementations and examples are discussed here and below, further implementations and examples may be possible by combining the features and elements of individual implementations and examples.

DETAILED DESCRIPTION

Overview

Patterned metal and inorganic dielectric material, such as silicon oxide, layers are frequently provided on a die, wafer, or other substrate (hereinafter "die") as a hybrid bonding, or DBI®, surface layer. The dielectric layer is typically highly planar (usually to nm-level roughness) with the metal layer (e.g., embedded conductive features) at or recessed just below the oxide surface. The amount of recess below the oxide is typically determined by a dimensional tolerance, specification, or physical limitation. The hybrid surface is often prepared for bonding with another die, wafer, or other substrate using a chemical-mechanical polishing (CMP) step.

The devices and techniques disclosed herein allow further etching of the oxide (or other insulating layer) after the CMP step to form an opening, cavity, or recess in or through the bonding layer. The openings or recesses allow for features or structures to be formed and accessed, such as wirebond pads, testing pads, die cavities, and so forth. Forming such cavities may mean that additional openings need to be etched into the hybrid bonding surface layer after the CMP step, but prior to bonding. Such cavities may be used to create access ports for sensor applications (e.g., DNA analysis), physical and electrical access (e.g. for testing, wirebonding, electrical connection, etc.), low-impedance, low-loss connections, air bridges, and the like.

The techniques described herein are useful to form shallower cavities, recesses or openings in the individual dies or wafers prior to bonding, thereby avoiding having to etch a deeper single cavity in both dies or wafers after bonding. This process also results in a cleaner bond pad surface and finer pitch capability than would be possible with oxide etching after bonding. In addition, the process also allows for the formation of cavities with different dimensions in the top and bottom wafer or die. For example, a trench opening may be formed in the bottom die and a spot opening may be formed in the top die, or vice versa. Alternatively, an opening formed in the bottom die can be larger than an opening formed in the top die, or vice versa (see FIGS. 29-32).

As will be appreciated, this cavity etching technique can improve metal seal ring or electrical contact for a microelectromechanical systems (MEMS) or other sensor applications, as well. The techniques described herein also improve bonding through a process of street etching before die singulation. This improves dicing by reducing chipping and improves transistor reliability in the field.

FIGS. 1-33 illustrate representative devices and processes for forming and preparing various microelectronic components (such as dies 102, for example) for bonding, such as for direct bonding without adhesive. The processes include providing a bonding surface (such as bonding surface 108, for example) on the microelectronic components, or two bonding surfaces in some examples (not shown), providing conductive interconnect features or structures embedded into the bonding surfaces, repairing or mitigating erosion, dishing, and the like in the bonding surfaces due to processing or defects, pre-etching one or more openings in the bonding surfaces, forming microelectronic assemblies by directly bonding the microelectronic components at the bonding surfaces, and so forth.

The order in which the processes are described is not intended to be construed as limiting, and any number of the described process blocks in the processes can be combined in any order to implement the processes, or alternate processes. Additionally, individual blocks may be deleted from any of the processes without departing from the spirit and scope of the subject matter described herein. Furthermore, the processes can be implemented in any suitable hardware, software, firmware, or a combination thereof, without departing from the scope of the subject matter described herein. In alternate implementations, other techniques may be included in the processes in various combinations and remain within the scope of the disclosure.

Figure 2:
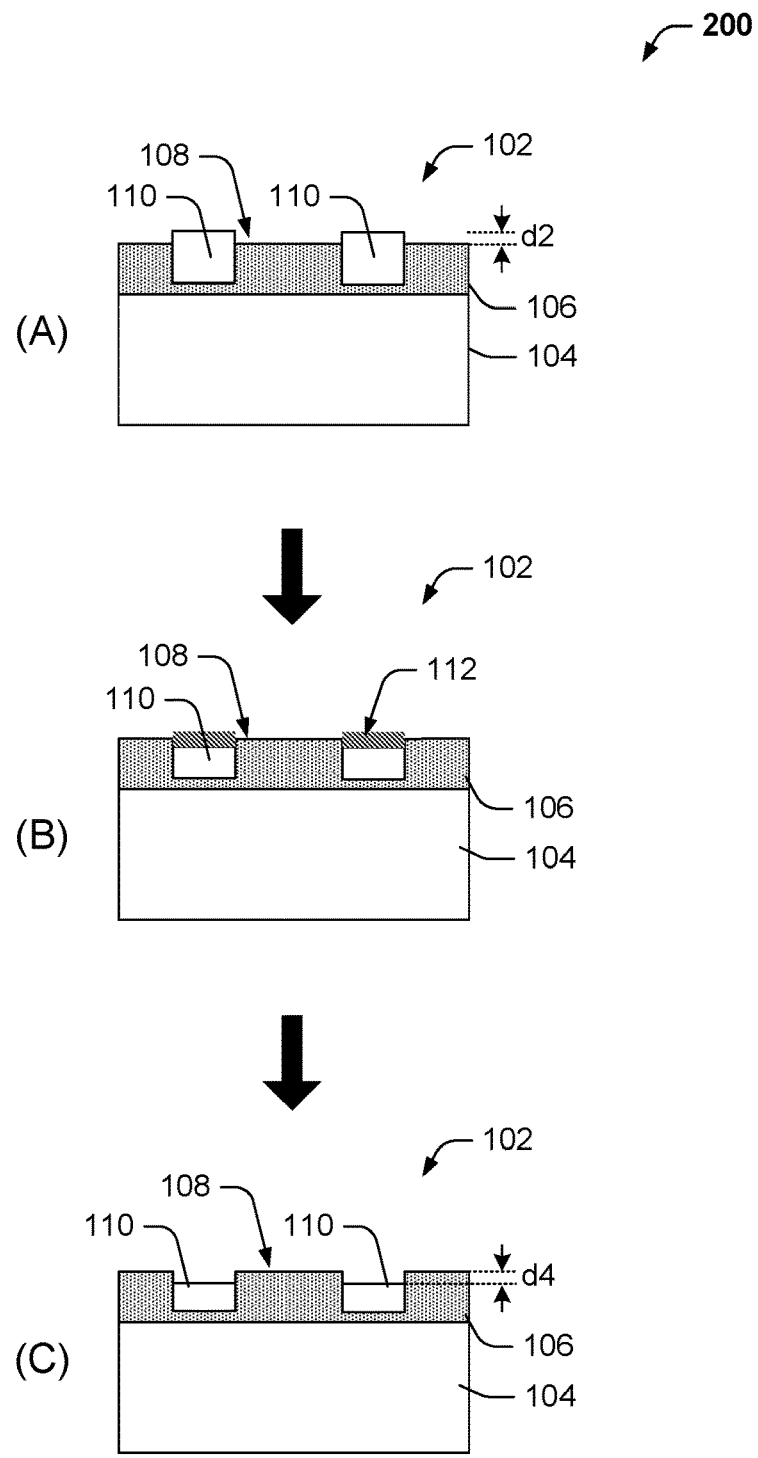

Referring to FIGS. 1 and 2, and processes 100 and 200 respectively, a representative "die" 102 may be formed using various techniques, to include a base substrate 104 and an insulating or dielectric layer 106. The base substrate 104 may be comprised of silicon, germanium, glass, quartz, a dielectric surface, direct or indirect gap semiconductor materials or layers or another suitable material, plus multiple layers of metal wiring in insulating dielectrics that are commonly referred to as the Back-End-of-Line (BEOL) layers. The insulating layer 106 is deposited or formed over the substrate 104, and may be comprised of an inorganic dielectric material layer such as oxide, nitride, oxynitride, oxycarbide, carbides, carbonitrides, diamond, diamond like materials, glasses, ceramics, glass-ceramics, and the like. The insulating layer 106 can be the last layer of BEOL, or an additional layer deposited specifically for hybrid bonding, for instance.

A bonding surface 108 of the die 102 can include conductive features 110, such as interconnect structures for example, embedded into the insulating layer 106 and arranged so that the conductive features 110 from respective bonding surfaces 108 of opposing dies 102 can be mated and joined during bonding, if desired. The joined conductive features 110 can form continuous conductive interconnects (for signals, power, etc.) between stacked dies 102.

Damascene processes (or the like) may be used to form the embedded conductive features 110 in the insulating layer 106. The conductive features 110 may be comprised of metals (e.g., copper, etc.) or other conductive materials, or combinations of materials, and include structures, traces, pads, patterns, and so forth. The conductive features 110 may be included in the insulating layer 106 to provide an electrical and/or thermal path or may instead be configured to balance out the metallization of the bonding surface 108, through the use of additional pads or so-called dummy pads, traces, patterns or the like. After the conductive features 110 are formed, the exposed surface of the die 102, including the insulating layer 106 and the conductive features 110 can be planarized (e.g., via CMP) to form a flat bonding surface 108.

As shown in FIGS. 1 and 2, at block A of processes 100 and 200, one or more bonding surfaces 108 of a die 102, including embedded interconnect structures 110, can be planarized (using chemical-mechanical polishing (CMP), or the like) to prepare the surface(s) 108 for bonding. Forming the bonding surface 108 includes finishing the surface 108 to meet dielectric roughness specifications and metallic layer (e.g., copper, etc.) recess specifications, to prepare the surface 108 for direct bonding. In other words, the bonding surface 108 is formed to be as flat and smooth as possible, with very minimal surface topography variance. Various conventional processes, such as chemical mechanical polishing (CMP) may be used to achieve the low surface roughness. This process provides the flat, smooth surface 108 that results in a reliable bond between dies 102.

In some cases, as shown in FIG. 1, process 100, block A, the exposed surface of the conductive features 110 may be intentionally recessed relative to the bonding surface 108, for example to a depth "d1," to allow for material expansion, particularly during heated annealing, if it is to be performed. In other cases, as shown in FIG. 2, process 200, block A, the exposed surface of the conductive features 110 may be formed to exceed the recess specification, and may protrude above the bonding surface 108 to a height "d2," to allow for oxidation of the conductive features 110 during later processing. This may be accomplished by selective etching of the dielectric layer 106, for example.

During polishing or other process steps (such as forming an opening in the bonding layer 108 after the polishing step), the conductive features 110 at the bonding layer 108 may change (e.g., become oxidized) and become out of the desired specification. This is illustrated at FIGS. 1 and 2, processes 100 and 200, block B, where the oxidation is shown at 112.

The conductive features 110 may be adjusted, as shown at FIGS. 1 and 2, processes 100 and 200, block C, to improve the subsequent bonding and electrical connection. The adjustment can be achieved by a selective wet etch of the conductive features 110, for instance with a chemical etch that selectively dissolves the metal oxide (e.g., copper oxide) formed on the conductive features 110, or by a touch-up CMP process, or the like. After the adjustment, the recess of the conductive features 110 relative to the bonding surface 108 is within tolerance of the specification (e.g., "d3" and "d4").

Example Embodiments

Figure 3:
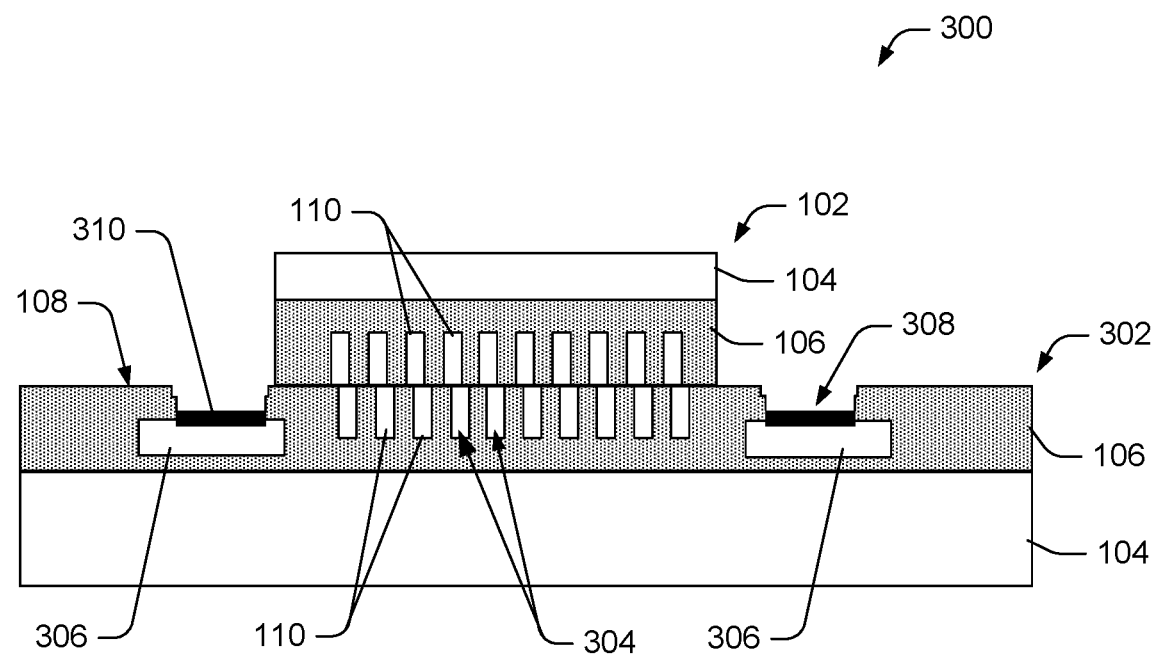
FIG. 3 shows an example assembly formed from stacked and bonded devices, having hybrid bonding pads and peripheral pads, according to an embodiment.

Referring to FIG. 3, a microelectronic assembly 300 is shown, comprising at least two directly bonded (e.g., without adhesive) dies 102 and 302. Alternately, the microelectronic component 302 may comprise a wafer, or other substrate, or the like. However, the microelectronic component 302 includes one or more contact pads 306 that are disposed outside of the die 102 perimeter.

Embedded electrically conductive features 110 (e.g., hybrid bonding pads, etc.) of both dies 102 and 302 extend to the bonding surfaces 108 of the dies 102 and 302 and are bonded together, forming bonded interconnect structures 304. In an embodiment, the first die 102 may be formed as described above at processes 100 or 200.

Contact pads 306 (i.e., exposed non-hybrid conductive pads) of die 302 are exposed through the bonding surface 108 of the die 302 due to the openings 308 in the insulating layer 106 of the die 302. As discussed above, contact pads 306 may be used for testing, wirebonding, other electrical connection, and so forth regarding the die 302. In some embodiments, a conductive coating 310, comprising nickel, gold or other metals, for example, may be disposed over the contact pads 306 to protect the pads 306 from oxidation, corrosion, or the like.

In an implementation, the second die 302 may be formed as described in process 400, including forming the openings 308 prior to bonding the second die 302 to the first die 102. Alternately, in some embodiments with the structure 300, the openings 308 may be formed in the second die 302 after bonding to the first die 102.

Figure 4:
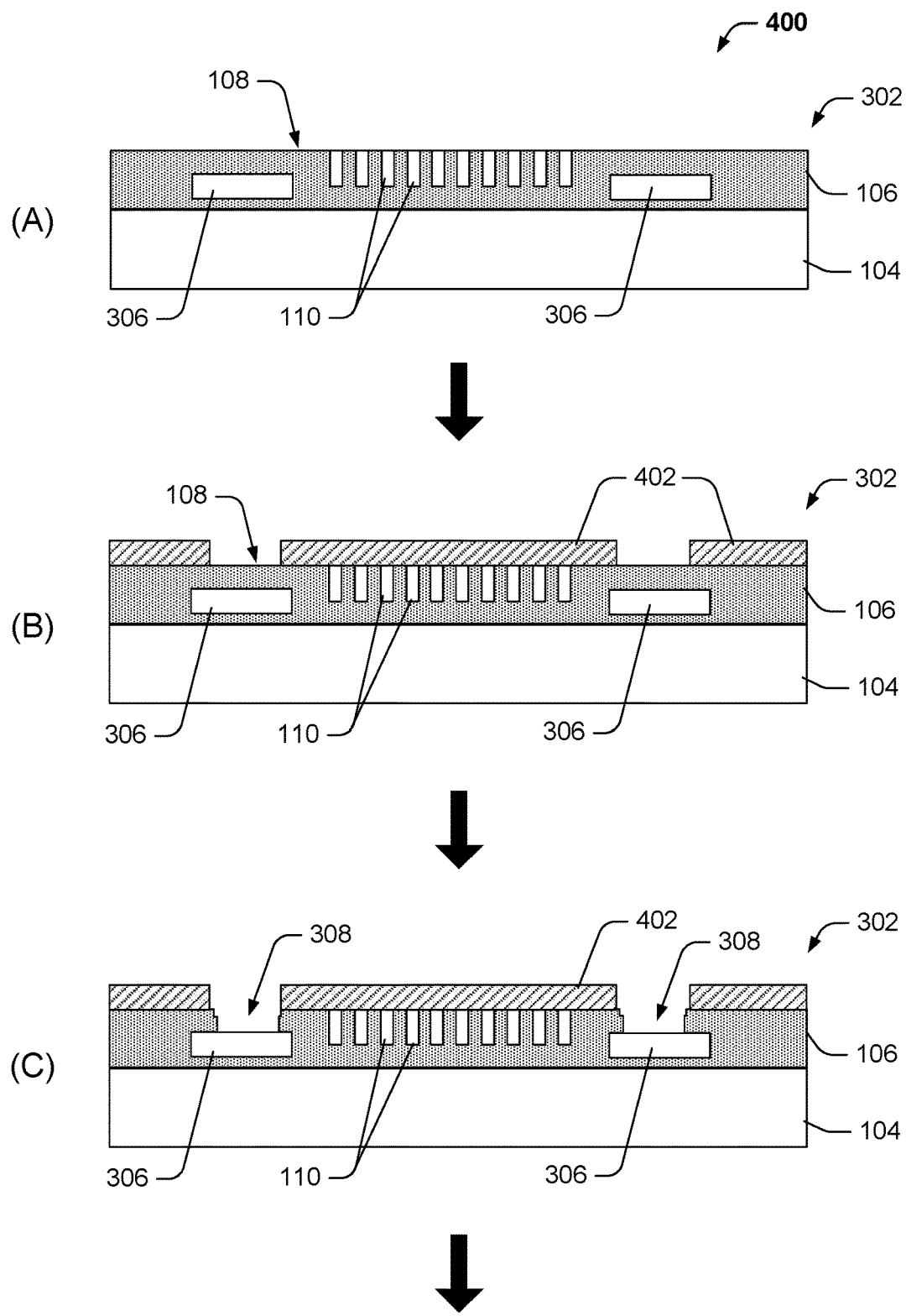
FIGS. 4 and 5 illustrate a graphical flow diagram showing an example process for forming one of the devices of the assembly of FIG. 3, according to an embodiment.

Referring to FIG. 4, process 400 (see also FIG. 33 for a text flow diagram to complement the graphical flow diagram of FIGS. 4 and 5), at block A, the die 302 is formed and prepared for direct bonding, including forming the insulating layer 106 on the base substrate 104, forming one or more conductive features 110 in the insulating layer 106, and forming the highly planar bonding layer 108 as described above. In an implementation, the process 400 includes forming buried contact pads 306 within the insulating layer 106.

At block B, the process 400 includes forming a patterned resist layer 402 over the bonding surface 108, with patterned gaps in the resist layer 402 aligned over the buried contact pads 306. Optionally, the patterned resist layer 402 may include gaps over the dicing street, if desired. At block C, the process 400 includes etching the insulating layer 106 through the gaps in the resist layer 402, forming the openings 308 to expose the buried contact pads 306.

Figure 5:
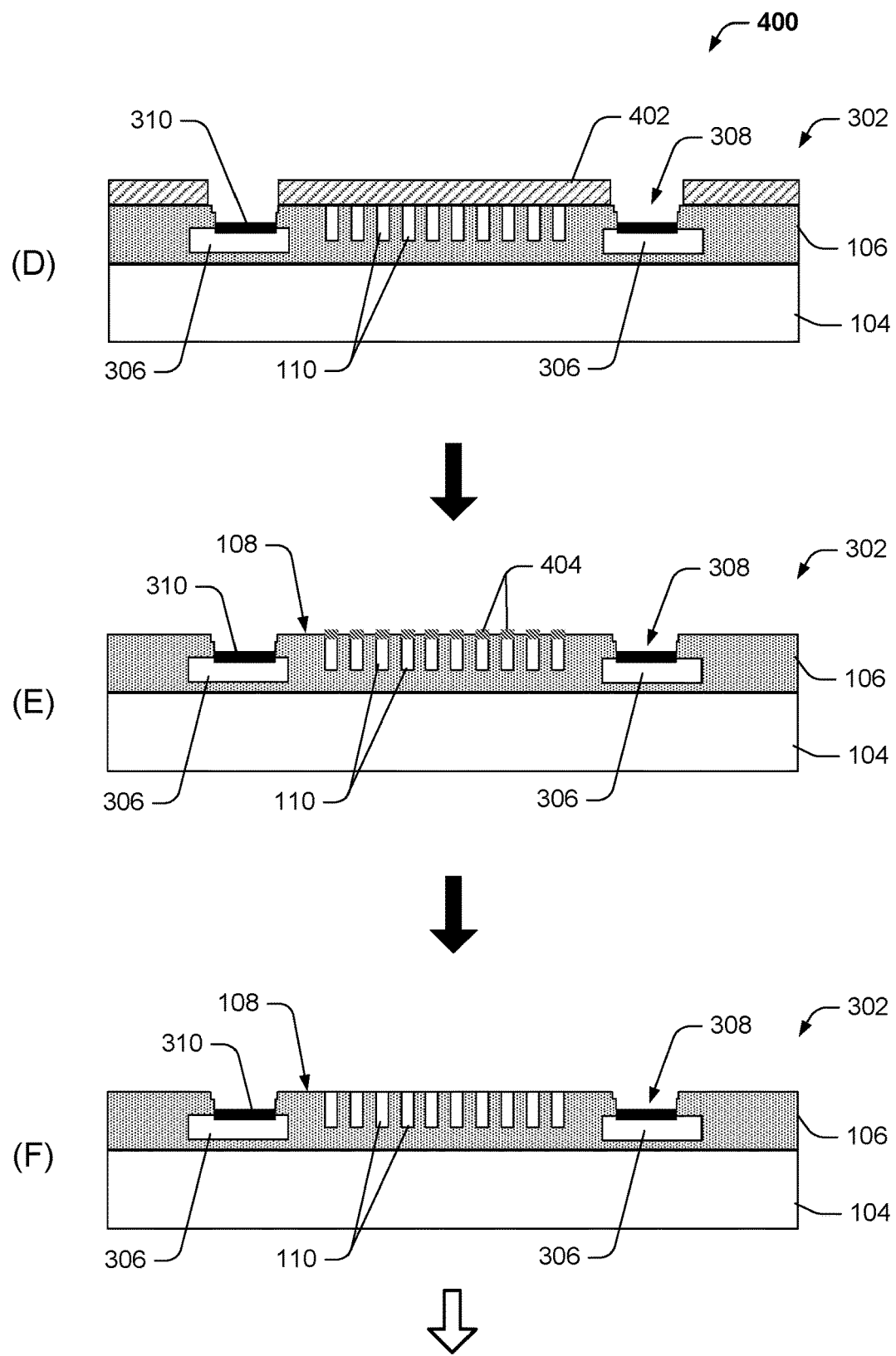

Referring to FIG. 5, at block D, the process 400 includes optionally covering the uncovered contact pads 306 with a protective metallic layer 310 (e.g., nickel, gold, silver, solder, etc.) if desired to protect the pads 306. The protective layer 310 may be applied using electroless plating, for example, or another technique if desired, such as immersion plating or the like.

At block E, the process 400 includes removing the resist 402 from the bonding surface 108. The resist 402 may be removed using a wet strip followed by oxygen plasma ashing, for example. In some cases, the resist 402 removal steps may cause the surfaces of the conductive features 110 to oxidize (forming copper oxide 404, for example). Depending on the amount of oxidation 404, the surfaces of the conductive features 110 may protrude above the bonding surface 108, as shown in FIG. 5.

At block F, the process 400 includes removing the oxidation 404 from the conductive features 110. For example, the oxidation 404 may be about 1-100 nm thick. Alternately, the oxidation may be thicker in some cases. In any case, controlling the rate of material removal, including the rate of removing oxidation 404, as well as the rate of removing some of the metal (e.g., copper, etc.) of the conductive structures 110 to adhere to recess specifications, can be of importance. For instance, removing the correct amount of material can avoid having to refabricate the die 302, including reforming the insulating layer 106 and/or the conductive structures 110. Unfortunately, it can be easy to over-etch material using many of the commonly used techniques.

In various embodiments, controlled, selective etching techniques are used to remove the oxidation 404, which may include etching the oxide 404 with a dilute formulary, such as a 1:20 ratio of sulfuric acid or sulfonic acid and water. Alternately, a light CMP with a slurry formulated for polishing a barrier layer (such as a barrier layer deposited into a cavity of an insulating layer 106 prior to copper deposition during a Damascene process, for example) can be used to selectively remove the oxidation 404. However, the use of chemical etching may be more easily controlled for nanometer scale material removal. The specified recess for the conductive features 110 may be achieved as part of the oxidation 404 removal step with controlled material removal.

Figure 5A:
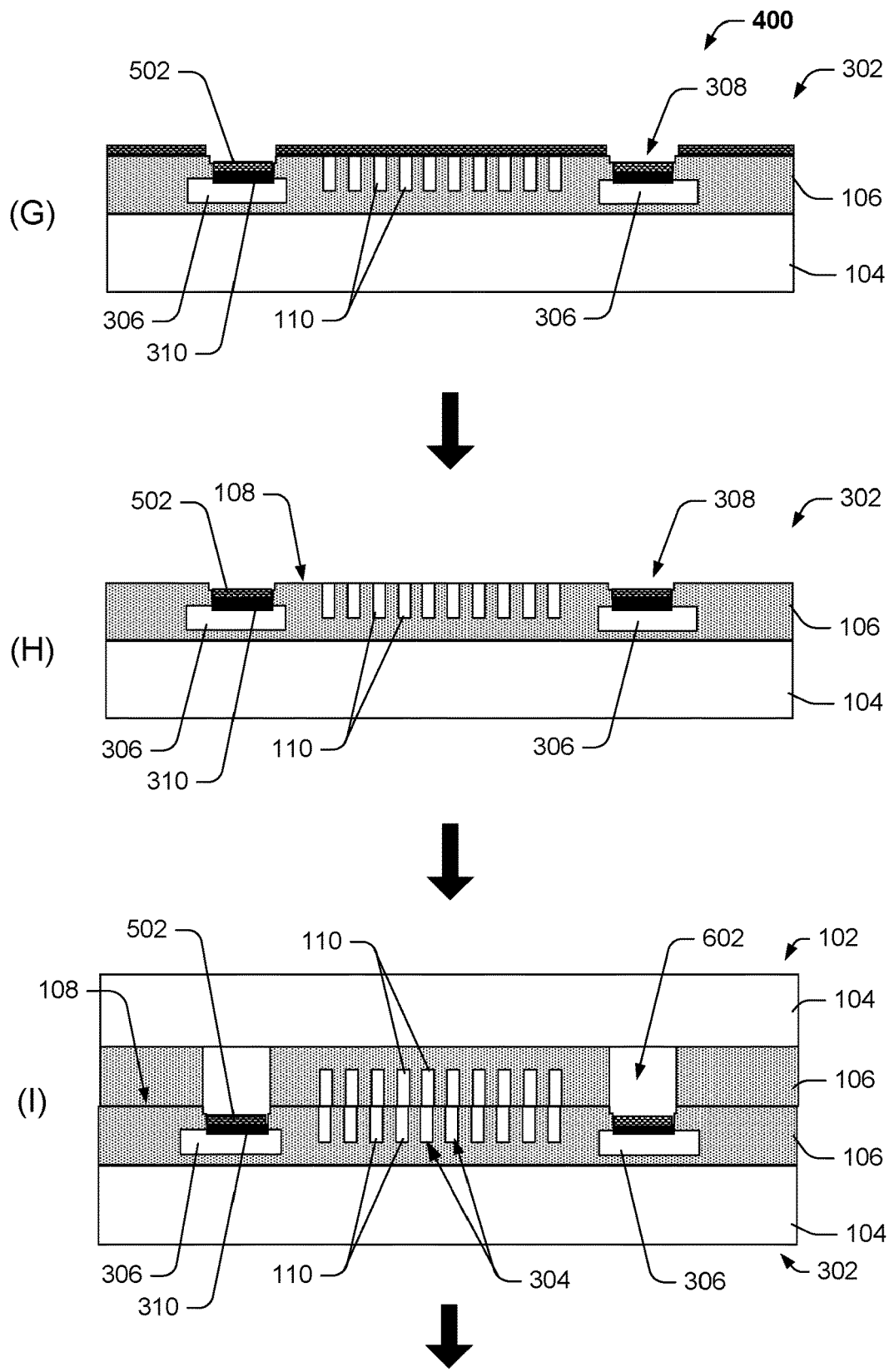
FIGS. 5A-5C illustrate optional steps to the example process described at FIGS. 4 and 5, according to an embodiment.
Figure 5B:
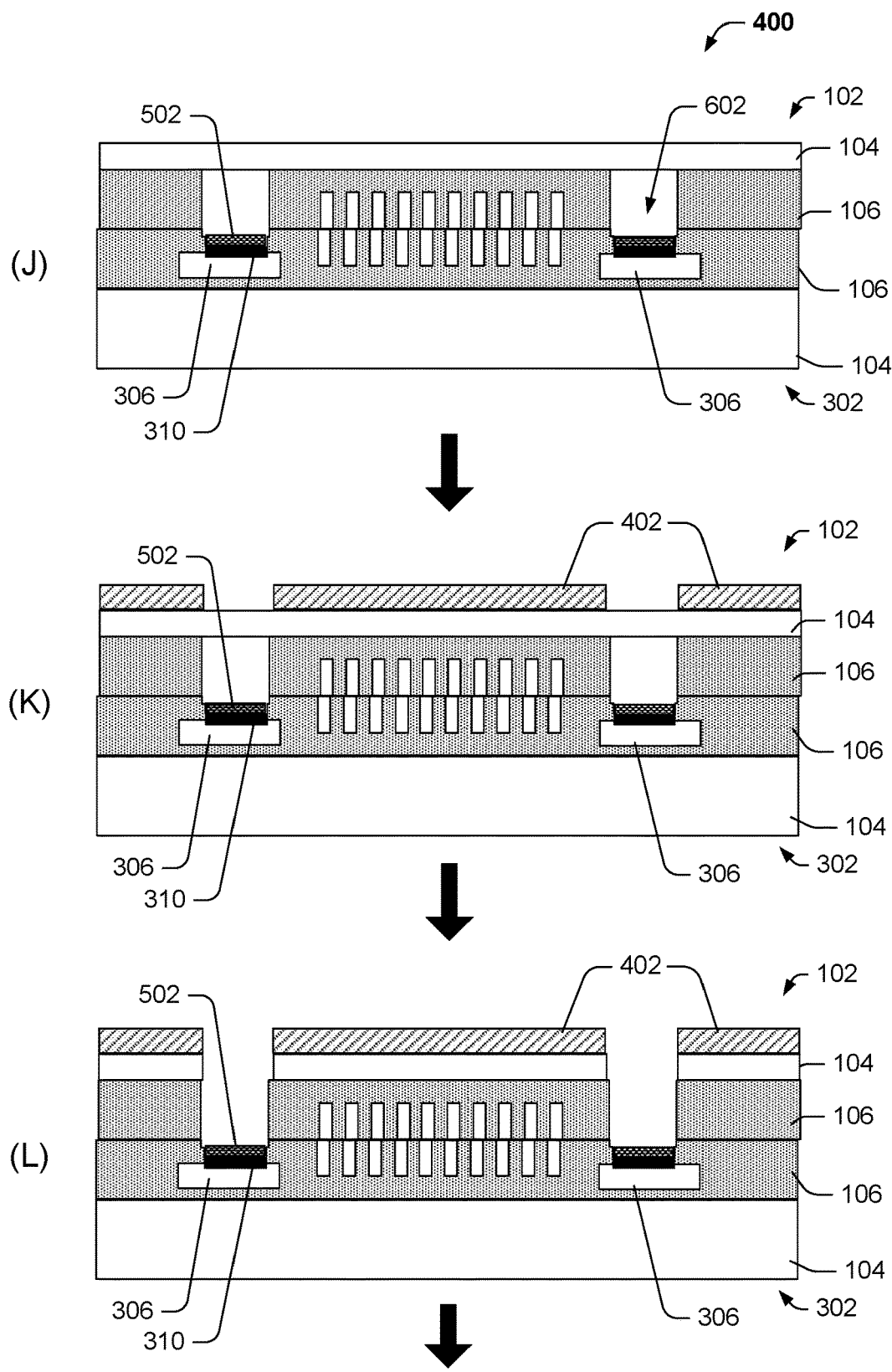
Figure 5C:
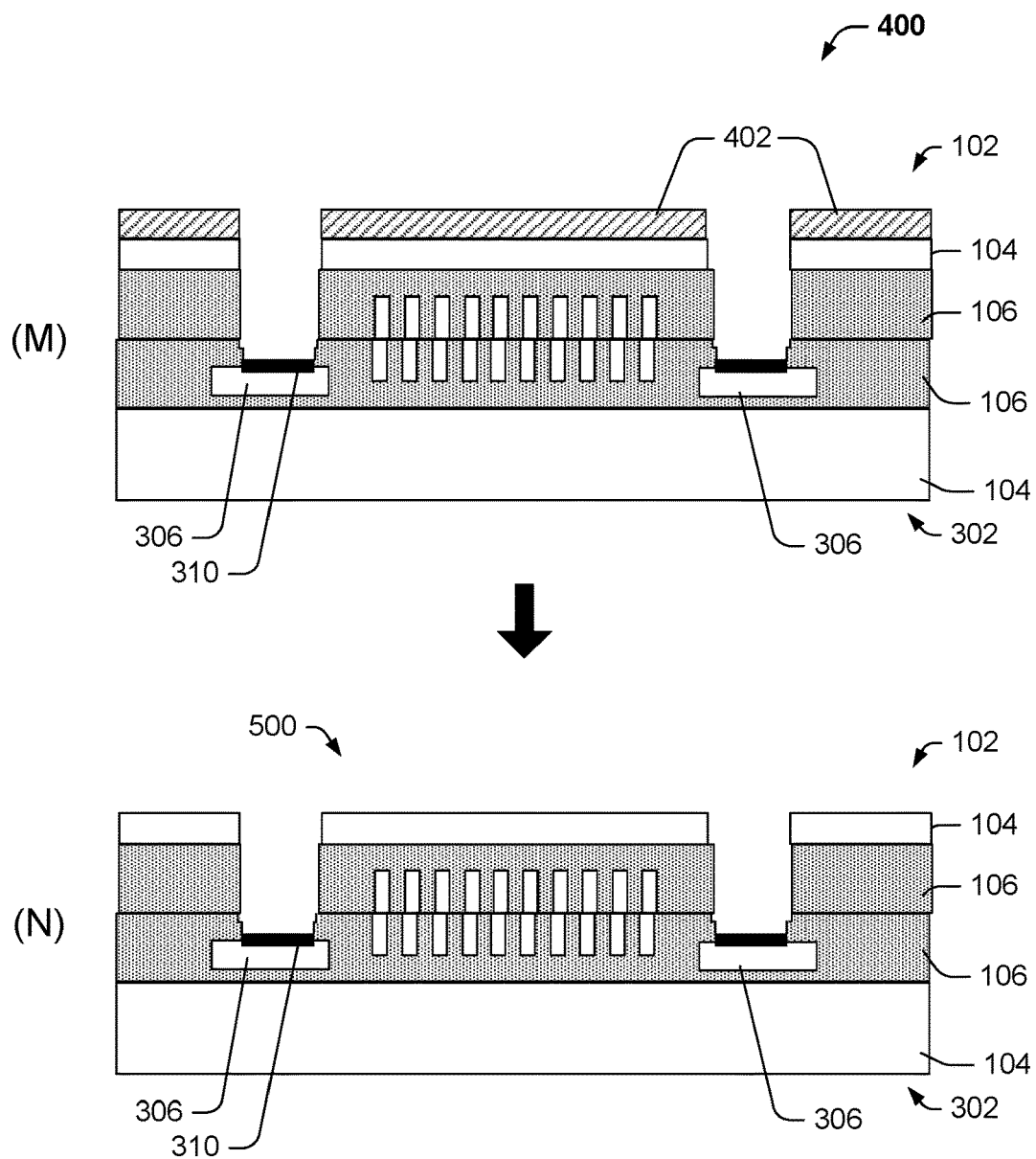

Referring to FIGS. 5A-5C, as alternative steps to the process 400, or in addition to the process steps in blocks D through F, one or more optional layers may be deposited over the exposed contact pads 306 (and the protective metallic layer 310), which may include depositing the layer(s) over the bonding surface 108 of the die 302. For instance in some cases, electrochemical enhancement of etching on some conductive features 110 may be experienced, due to bimetal effects and photovoltaic effects for conductive features 110 coupled to circuits or exposed bond pads. These effects can result in corrosion of the contact pads 306.

In these cases, (referring to FIG. 5A at block G) a layer 502 of approximately 10-200 nm of oxide and/or barrier metal can be deposited over the bonding surface 108 and the contact pads 306 (including the protective metallic layer 310) of the die 302. As shown at block H, CMP (or the like) can be used to re-expose the conductive features 110 on the bonding surface 108. The layer 502 remains on the contact pads 306. At block I, a first die or wafer 102 is direct bonded to the second die 302, without adhesive.

Referring to FIG. 5B, at block J, after the second die 302 is bonded to the first die or wafer 102, the top base layer 104 of the first die or wafer 102 can be thinned. At block K, a patterned resist layer 402 is applied to the top surface of the die 102, with gaps in the resist at locations where it is desired to remove the base layer 104 (for instance, over the openings 602 as well as other locations, as desired). At block L, openings are etched in the base layer 104 of the wafer or die 102 to access the contact pads 306. The openings in the base layer 104 of the die 102 can be formed to be the same size as the openings in the insulating layer 106 of either or both of the die 102 and the die 302, or it can be larger or smaller than the mating openings in the die 102 and/or the die 302.

Referring to FIG. 5C, at block M, with openings created in the base layer 104 of the wafer or die 102, the thin layer 502 over the contact pad 306 can be removed with a brief blanket dry etch, or like technique. Then the photo resist 402 can be removed as shown at block N. The resist 402 may be removed using a wet strip, for example. The resulting microelectronic assembly 500 is shown at block N.

Figure 6:
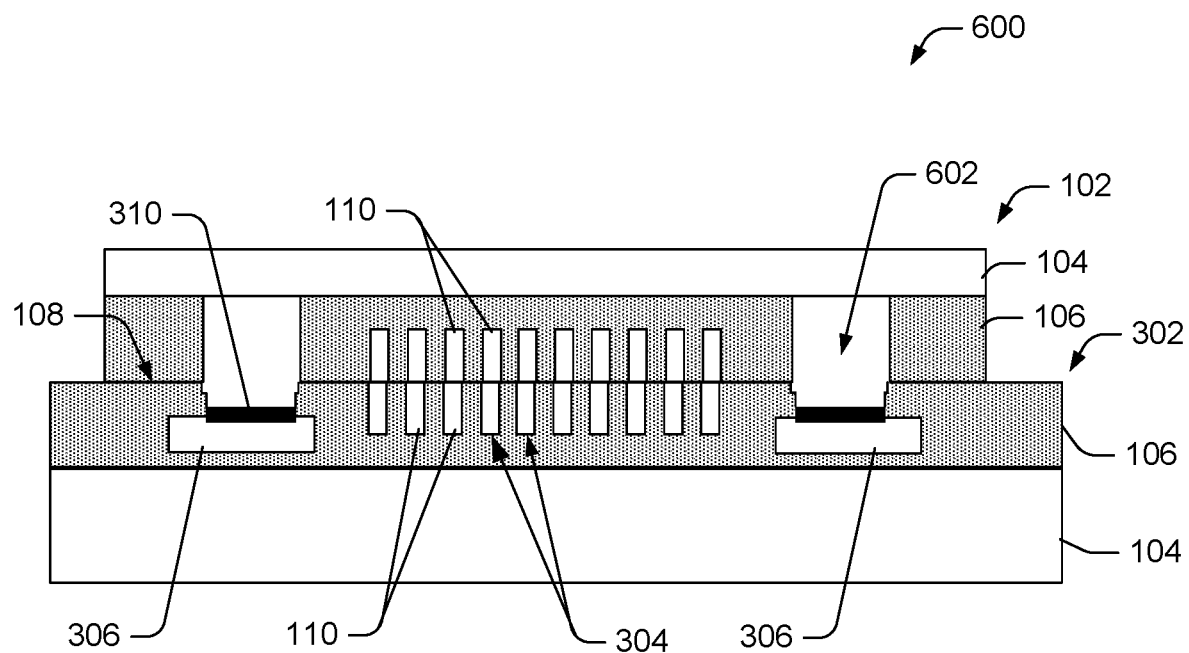
FIG. 6 shows an example assembly formed from stacked and bonded devices, having hybrid bonding pads and peripheral pads inside the die perimeter, according to an embodiment.

Referring to FIG. 6, a microelectronic assembly 600 is shown, comprising at least two directly bonded (e.g., without adhesive) dies 102 and 302. Alternately, the microelectronic components 102 and 302 may comprise two dies, two wafers, one die and one wafer, or other substrates, or the like. However, the microelectronic component 302 includes one or more contact pads 306 that are disposed inside of the die 102 perimeter.

Embedded conductive features 110 (e.g., hybrid bonding pads, etc.) of both dies 102 and 302 extend to the bonding surfaces 108 of the dies 102 and 302 and are bonded together, forming bonded interconnect structures 304. In an embodiment, the first die 102 may be formed as described at process 700.

Figure 7:
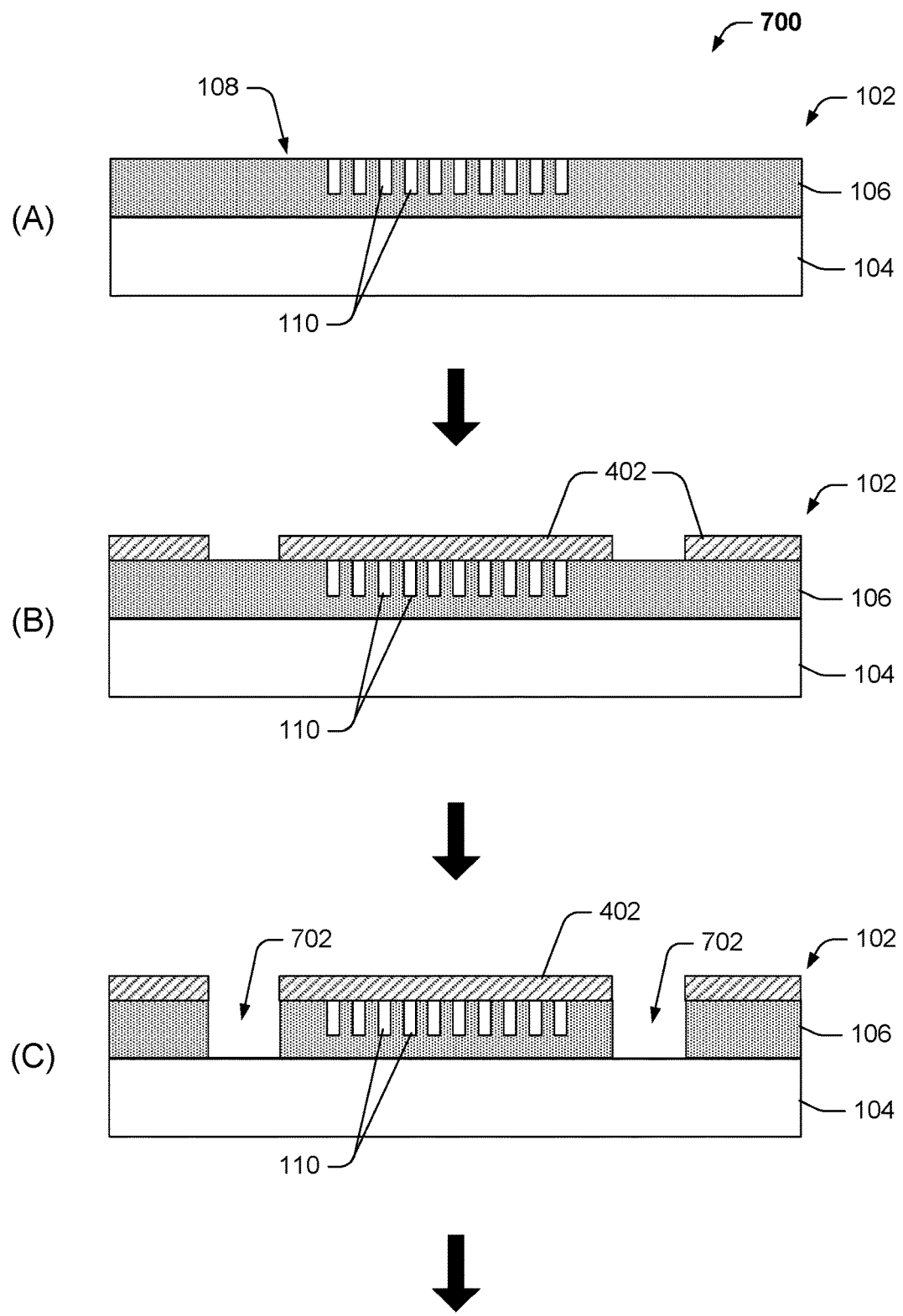
FIGS. 7 and 8 illustrate a graphical flow diagram showing an example process for forming one of the devices of the assembly of FIG. 6, according to an embodiment.

Referring to FIG. 7, and process 700, at block A, the die 102 is formed and prepared for direct bonding, including forming the insulating layer 106 on the base substrate 104, forming one or more conductive features 110 in the insulating layer 106, and forming the highly planar bonding layer 108 (using CMP, for instance) as described above. In various implementations, block A may be performed on a wafer, and the steps of process 700 may be performed prior to singulation (if desired).

At block B, the process 700 includes forming a patterned resist layer 402 over the bonding surface 108, with patterned gaps in the resist layer 402 aligned over a portion of the insulating layer 106 corresponding to locations for the buried contact pads 306 in the die 302, once the dies 102 and 302 are aligned and bonded. Optionally, the opening in die 102 can be formed to be the same size as the opening in die 302, or it can be larger or smaller than the mating opening in die 302. Optionally, the patterned resist layer 402 may include gaps over the dicing street, if desired. At block C, the process 700 includes etching the insulating layer 106 (and some of the base substrate 104, if desired) through the gaps in the resist layer 402, forming openings 702 in the insulating layer 106.

Figure 8:
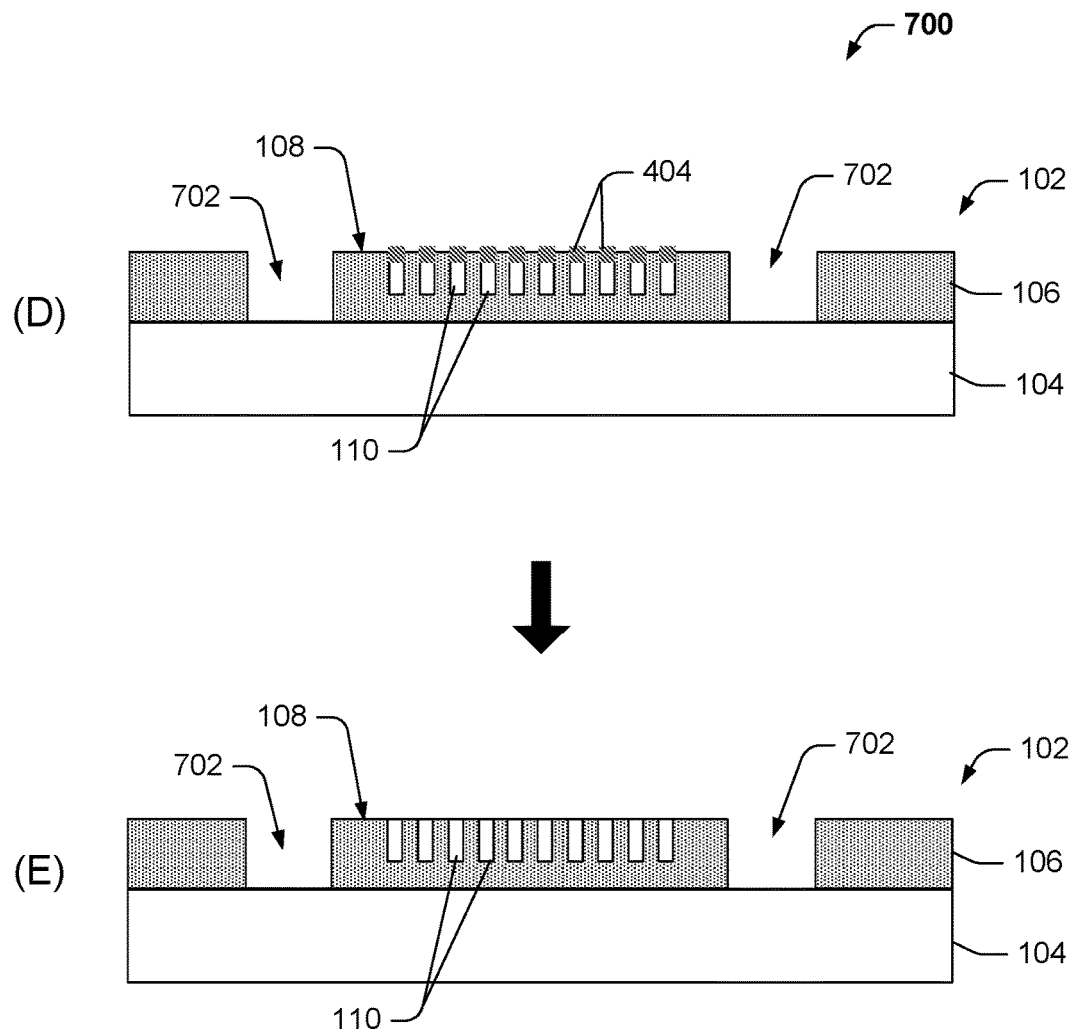

Referring to FIG. 8, at block D, the process 700 includes removing the resist 402 from the bonding surface 108. The resist 402 may be removed using a wet strip followed by oxygen plasma ashing, for example. In some cases, the resist 402 removal steps may cause the surfaces of the conductive features 110 to oxidize (forming copper oxide 404, for example). Depending on the amount of oxidation 404, the surfaces of the conductive features 110 may protrude above the bonding surface 108, as shown in FIG. 8.

At block E, the process 700 includes removing the oxidation 404 from the conductive features 110 using a CMP process with a slurry formulated for polishing a barrier layer, or the like, and/or a wet etch process as described above, while controlling the removal rate of material on the conductive features 110. For example, selective etching techniques are used to remove the oxidation 404, which may include etching the oxide 404 with a dilute formulary, such as a 1:20 ratio of sulfuric acid or sulfonic acid and water. The specified recess for the conductive features 110 may be achieved as part of the oxidation 404 removal step with controlled material removal.

In some cases, electrochemical enhancement of etching on some conductive features 110 may be experienced, due to bimetal effects and photovoltaic effects, for example. In these cases, 10 nm to 200 nm of oxide and/or barrier metal can be deposited over the bonding surface 108 and contact pad 306. CMP (or the like) can be used to re-expose the conductive features 110 on the bonding surface 108.

In an implementation, the second die 302 may be formed as described in process 900, including forming openings 308 in the insulating layer 106 of the die 302 prior to bonding the second die 302 to the first die 102.

Figure 9:
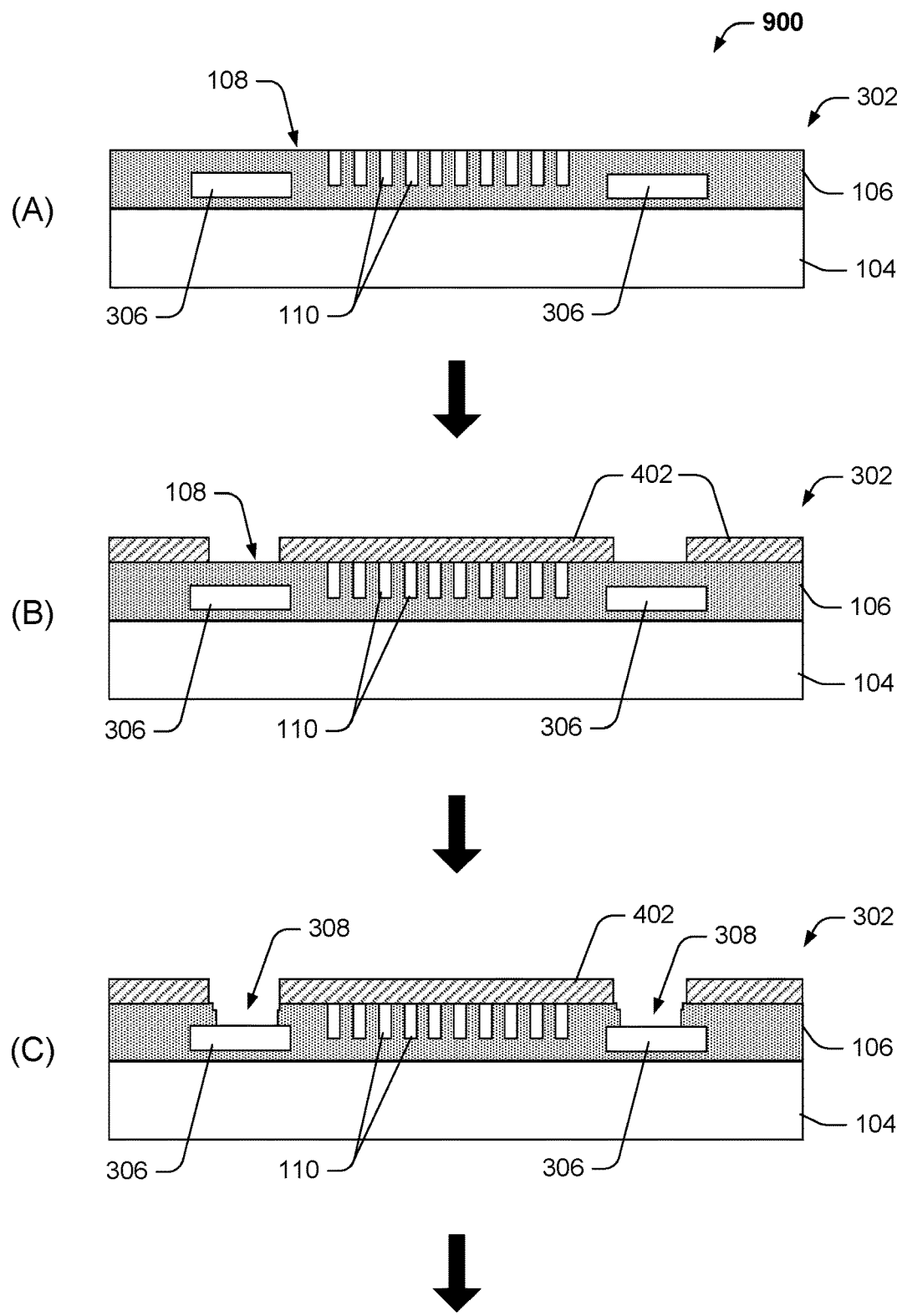
FIGS. 9 and 10 illustrate a graphical flow diagram showing an example process for forming another of the devices of the assembly of FIG. 6, according to an embodiment.

Referring to FIG. 9, process 900, at block A, the die 302 is formed and prepared for direct bonding, including forming the insulating layer 106 on the base substrate 104, forming one or more conductive features 110 in the insulating layer 106, and forming the highly planar bonding layer 108 as described above. In an implementation, the process 900 includes forming buried contact pads 306 within the insulating layer 106. In various implementations, block A may be performed on a wafer, and the steps of process 900 may be performed prior to singulation (if desired).

At block B, the process 900 includes forming a patterned resist layer 402 over the bonding surface 108, with patterned gaps in the resist layer 402 aligned over the buried contact pads 306. Optionally, the patterned resist layer 402 may include gaps over the dicing street, if desired. At block C, the process 900 includes etching the insulating layer 106 through the gaps in the resist layer 402, forming the openings 308 to expose the buried contact pads 306.

Figure 10:
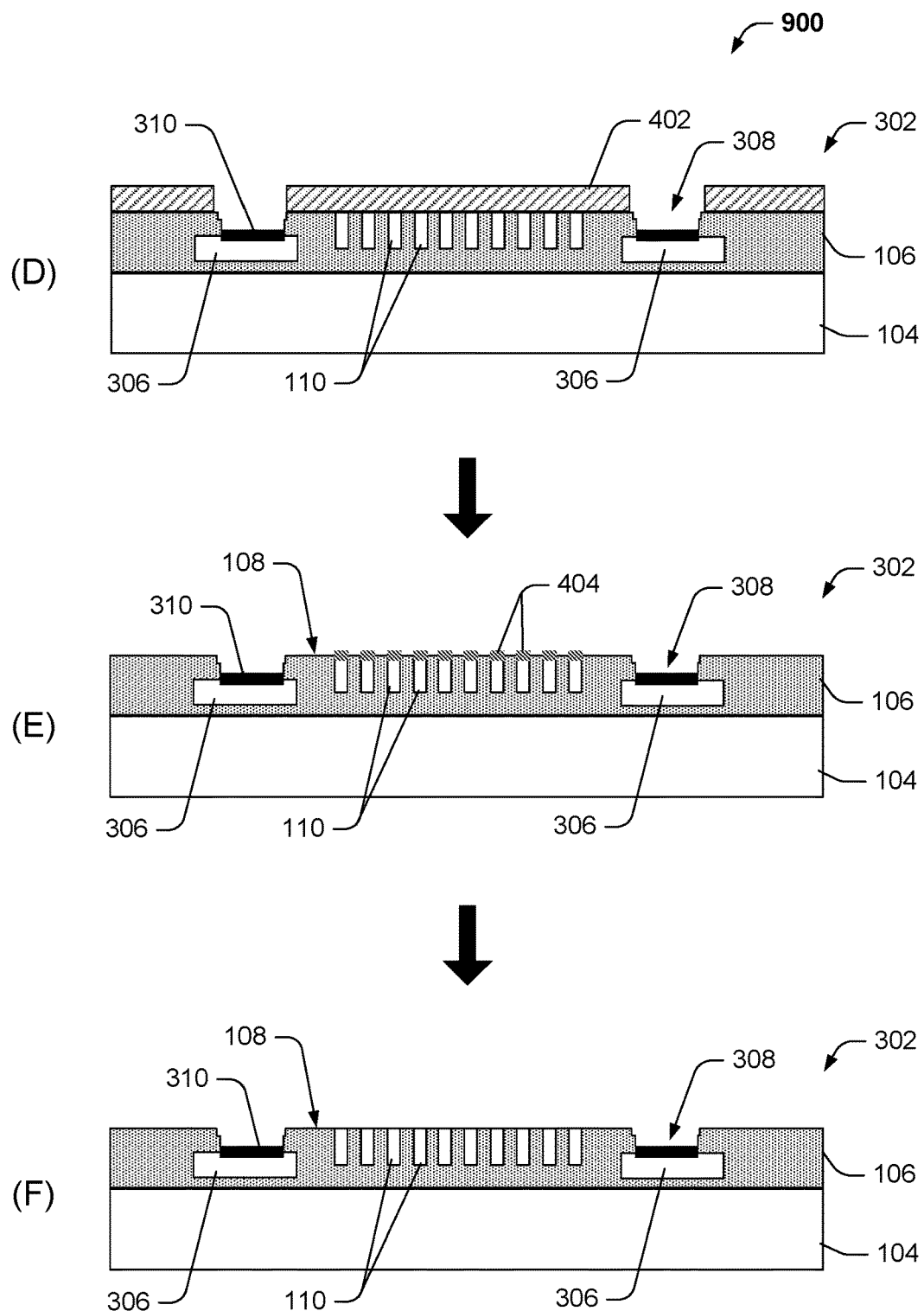

Referring to FIG. 10, at block D, the process 900 includes optionally plating the uncovered contact pads 306 with a protective metallic layer 310 (e.g., nickel, gold, silver, solder, etc.) if desired to protect the pads 306. The protective layer 310 may be applied using electroless plating, for example, or another technique if desired, such as immersion plating or the like.

At block E, the process 900 includes removing the resist 402 from the bonding surface 108. The resist 402 may be removed using a wet strip followed by oxygen plasma ashing, for example. In some cases, the resist 402 removal steps may cause the surfaces of the conductive features 110 to oxidize (forming copper oxide 404, for example). Depending on the amount of oxidation 404, the surfaces of the conductive features 110 may protrude above the bonding surface 108, as shown in FIG. 10.

At block F, the process 900 includes removing the oxidation 404 from the conductive features 110 using a CMP process and/or a wet etch process as described above, while controlling the removal rate of material on the conductive features 110. For example, selective etching techniques are used to remove the oxidation 404, which may include etching the oxide 404 with a dilute formulary, such as a 1:20 ratio of sulfuric acid (or sulfonic acid) and water, or a light CMP with a slurry formulated for polishing a barrier layer, or the like. The specified recess for the conductive features 110 may be achieved as part of the oxidation 404 removal step with controlled material removal.

In some cases, electrochemical enhancement of etching on some conductive features 110 may be experienced, due to bimetal effects and photovoltaic effects, for example. In these cases, approximately 10 nm to 200 nm of oxide and/or barrier metal can be deposited over the bonding surface 108 and over the contact pads 306 (not shown). CMP (or the like) can be used to re-expose the conductive features 110 on the bonding surface 108. After the second die 302 is bonded to the first die 102, the contact pads 306 can be accessed through openings created in the first die 102 and the pads 306 can be uncovered with a dry etch.

Referring back to FIG. 6, direct bonding the prepared dies 102 and 302 at the bonding surfaces 108 of each yields the microelectronic assembly 600. As shown, the opening 308 in the die 302 combines with the opening 702 in the die 102 to form a cavity 602 above the contact pads 306. In some embodiments, the base substrate 104 (which may comprise silicon, for example) of the first die 102 may be etched above the cavity 602 and the contact pads 306 to provide access to the contact pads 306 from outside the microelectronic assembly 600, if desired. In such embodiments, etching through the base layer 104 alone is preferred to etching through the base layer 104 and the insulating layer 106 of the die 102 while the first die 102 is bonded to the second die 302. Etching through the single layer 104 is much easier with the insulating layer 106 already removed, which improves the fabrication process. Further, this can result in a finer pitch opening over the pads 306 than would be possible when etching through both the base layer 104 and the insulating layer 106 of the die 102. In addition, this allows openings of different sizes and shapes within each of the two dies 102 and 302 bonded together, if desired.

Figure 11:
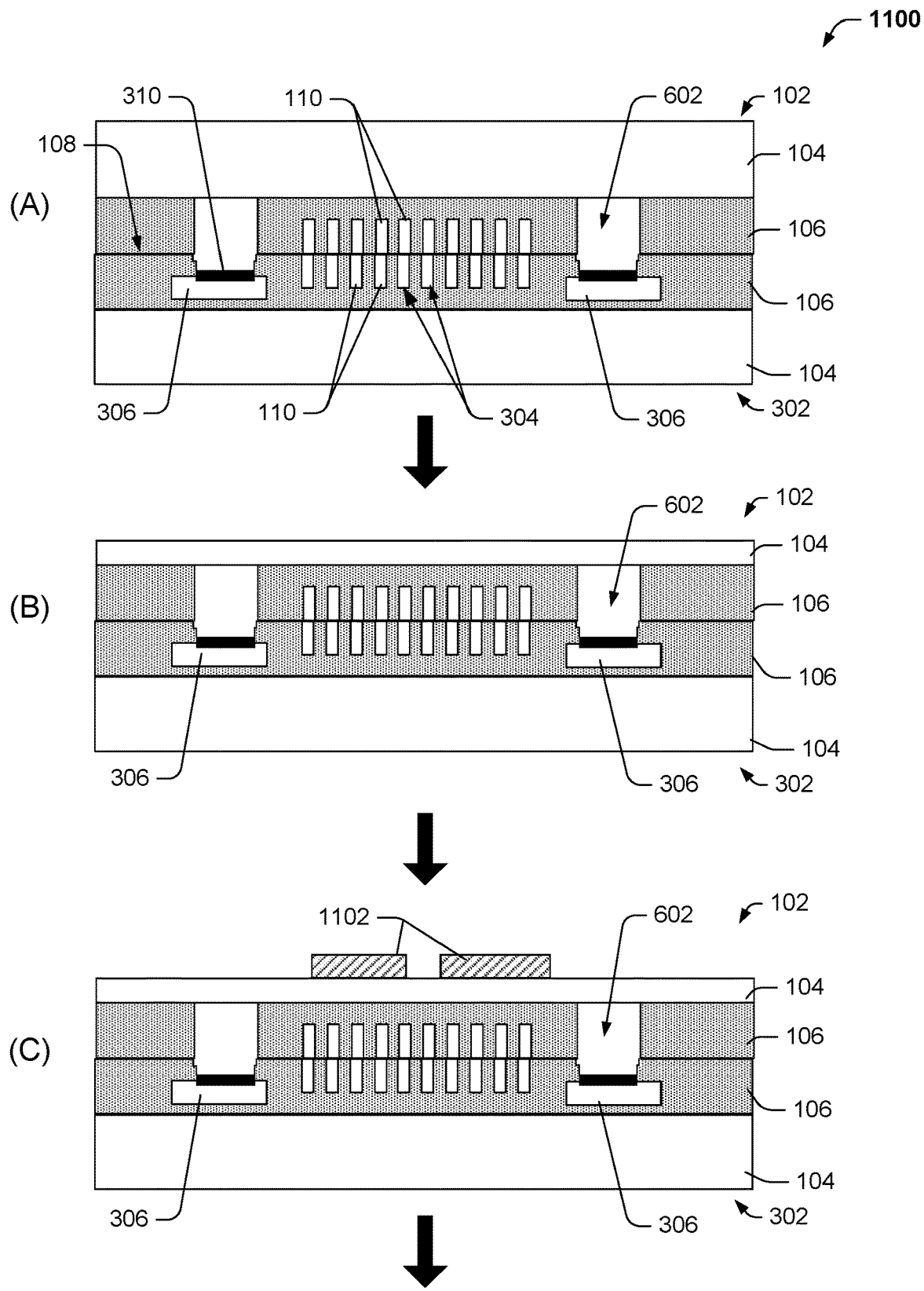
FIGS. 11 and 12 illustrate a graphical flow diagram showing an example process for forming an example assembly formed from stacked and bonded devices, having hybrid bonding pads and peripheral pads inside the die perimeter, according to an embodiment.

Referring to FIG. 11, a process 1100 for forming a microelectronic assembly 1200 is shown, comprising at least two directly bonded (e.g., without adhesive) dies 102 and 302. Alternately, the microelectronic component 302 may comprise a wafer, or other substrate, or the like. However, the microelectronic component 302 includes one or more contact pads 306 that are disposed inside of the die 102 perimeter.

Embedded conductive features 110 (e.g., hybrid bonding pads, etc.) of both dies 102 and 302 extend to the bonding surfaces 108 of the dies 102 and 302 and are bonded together, forming bonded interconnect structures 304. In an embodiment, the first die 102 may be formed as described above at process 700 and the second die 302 may be formed as described above at process 900. Accordingly, the process 1100 begins with a microelectronic assembly 600, or the like, where the first die 102 may have a footprint that is smaller, larger, or substantially the same size as the second die 302. In some cases, the first 102 and second 302 dies may be substantially aligned, or they may be slightly misaligned, but within hybrid bonding tolerances.

Referring to FIG. 11, at block A, an example microelectronic assembly is shown, such as the microelectronic assembly 600 discussed previously. At block B, the process 1100 includes thinning the top base wafer 104 of the first die 102 as desired. At block C, the process 1100 includes forming a patterned resist layer 1102 over the base layer 104 of the first die 102, with patterned gaps in the resist layer 1102 aligned over portions of the base layer 104 corresponding to locations where it is desired to remove portions of the base layer 104, including for example, over the cavities 602 and the buried contact pads 306 in the die 302, over non-active areas of the die 102, as well as other areas of the die 102 as desired.

Figure 12:
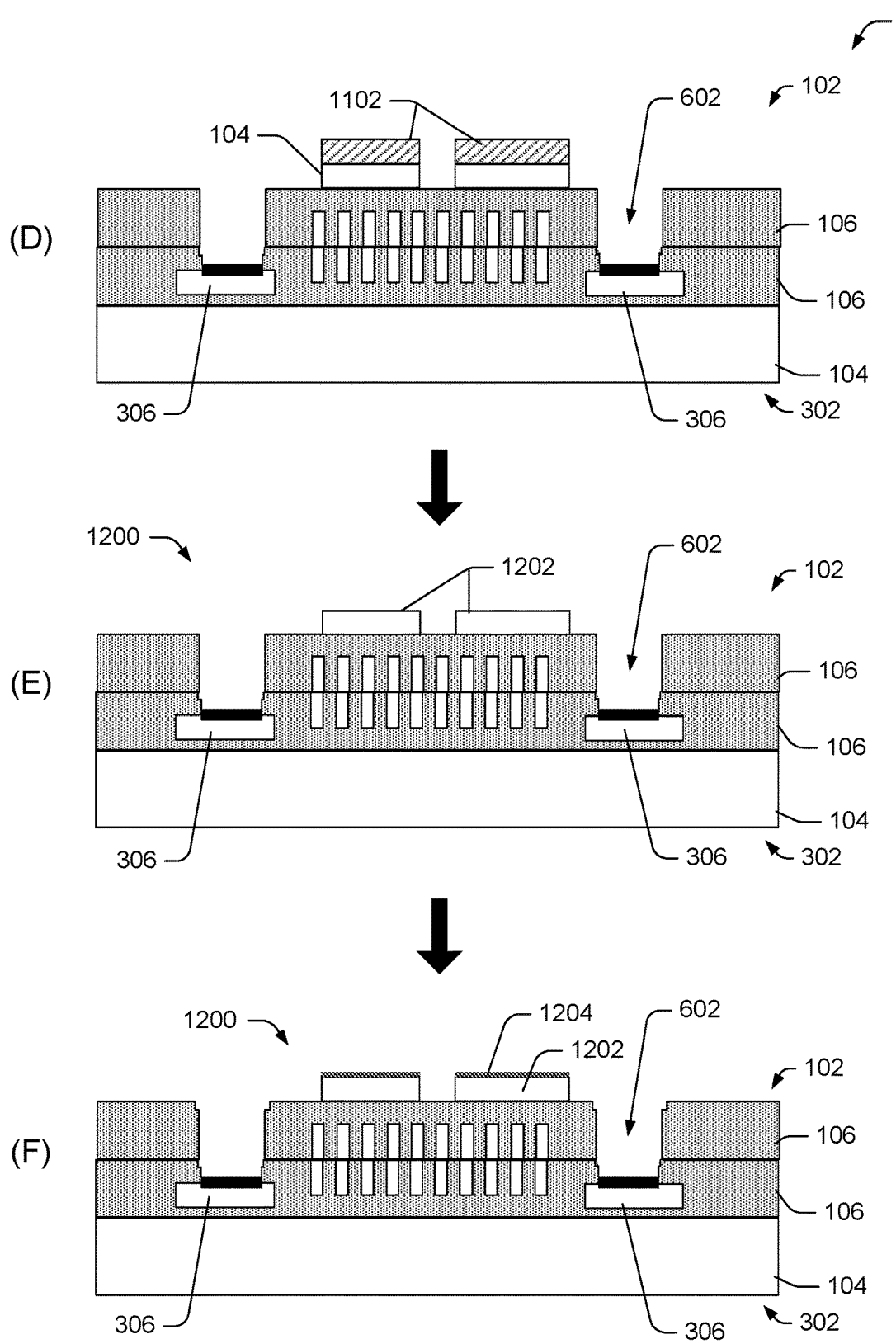

Referring to FIG. 12, at block D, the process 1100 includes etching the material (e.g., silicon, etc.) of the base layer 104 of the die 102 to reveal areas below, including the contact pads 306 (or other structure(s) in the cavity 602) in the second die 302. As shown, active base material (e.g., silicon) islands 1202 may be left on the top surface of the die 102 in active areas of the die 102. At block E, the process 1100 includes removing the resist 1102 from the base layer 104. The resist 1102 may be removed using a wet strip followed by oxygen plasma ashing, for example. This yields the microelectronic element 1200, as shown. At block F, the process 1100 may include an optional step where the base material islands 1202 may be electrically insulated and/or EMI shielded, or the like. In the case of an image sensor, laser, light emitting diode (LED), etc., an anti-reflection coating 1204, or the like, may be applied to the islands 1202.

Figure 13:
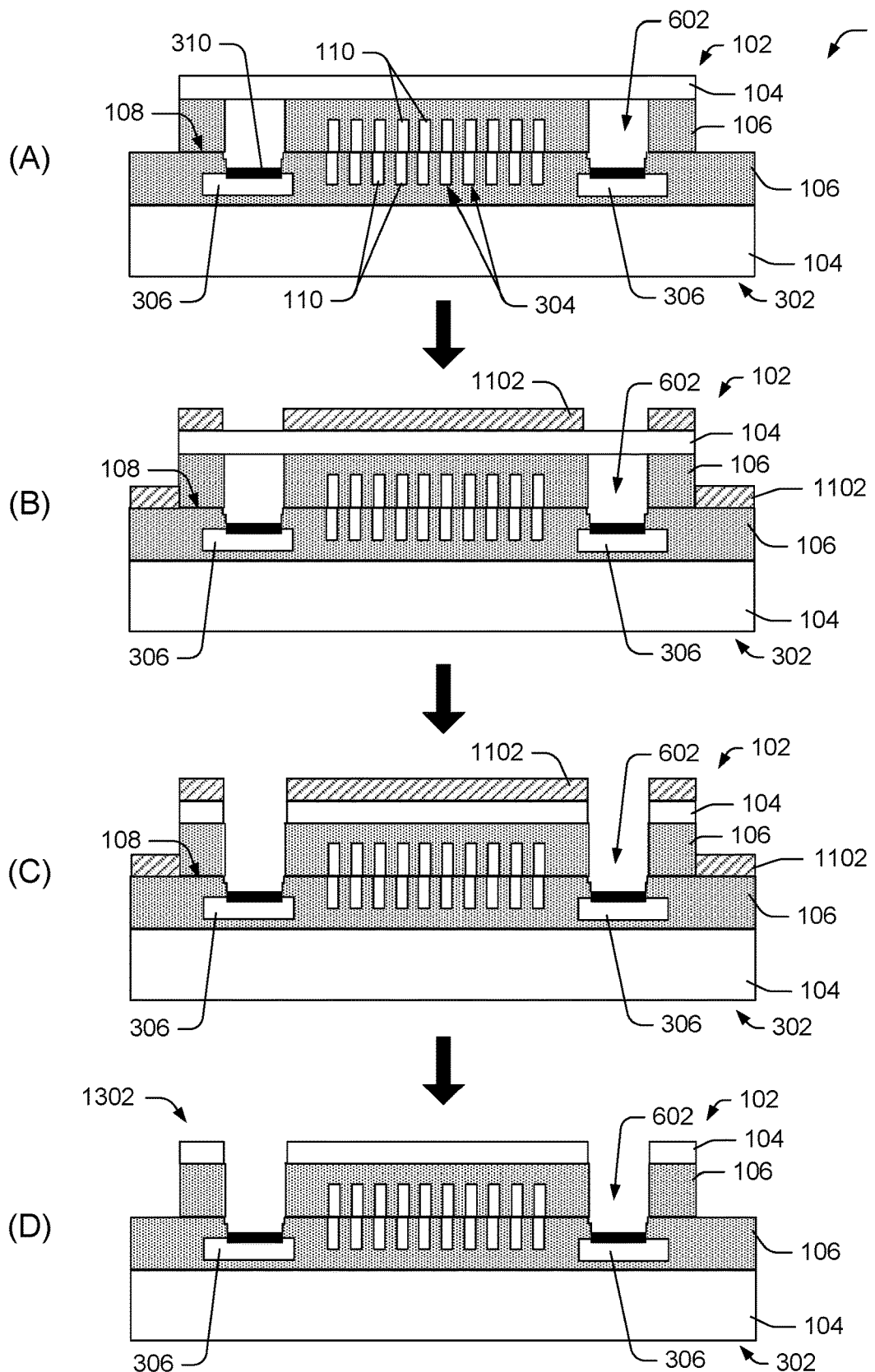
FIG. 13 illustrates a graphical flow diagram showing an example process for forming an example assembly formed from stacked and bonded devices, having hybrid bonding pads and peripheral pads inside the die perimeter, according to an embodiment.

Referring to FIG. 13, a process 1300 for forming a microelectronic assembly 1302 is shown, comprising at least two directly bonded (e.g., without adhesive) dies 102 and 302. Alternately, the microelectronic component 302 may comprise a wafer, or other substrate, or the like. However, the microelectronic component 302 includes one or more contact pads 306 that are disposed inside of the die 102 perimeter.

Embedded conductive features 110 (e.g., hybrid bonding pads, etc.) of both dies 102 and 302 extend to the bonding surfaces 108 of the dies 102 and 302 and are bonded together, forming bonded interconnect structures 304. In an embodiment, the first die 102 may be formed as described above at process 700 and the second die 302 may be formed as described above at process 900. Accordingly, the process 1300 begins with a microelectronic assembly 600, or the like, where the first die 102 may have a footprint that is smaller, larger, or substantially the same size as the second die 302. In some cases, the first 102 and second 302 dies may be substantially aligned, or they may be slightly misaligned, but within hybrid bonding tolerances.

At block A, an example microelectronic assembly is shown, such as the microelectronic assembly 600 discussed previously. At block B, the process 1300 includes forming a patterned resist layer 1102 over the base layer 104 of the first die 102, with patterned gaps in the resist layer 1102 aligned over a portion of the base layer 104 corresponding to locations for the cavities 602 and the buried contact pads 306 in the die 302. Additionally, as shown at block B, resist may be deposited at other locations, such as at predetermined portions of the bonding layer 108 of the die 302, or the like. Resist is placed at the additional locations to prevent etching of material at these locations.

At block C, the process 1300 includes etching the material (e.g., silicon, etc.) of the base layer 104 of the die 102 to reveal the contact pads 306 in the second die 302. At block D, the process 1300 includes removing the resist 1102 from the base layer 104. The resist 1102 may be removed using a wet strip followed by oxygen plasma ashing, for example. This yields the microelectronic element 1302, as shown.

Additional Embodiments

Figure 14:
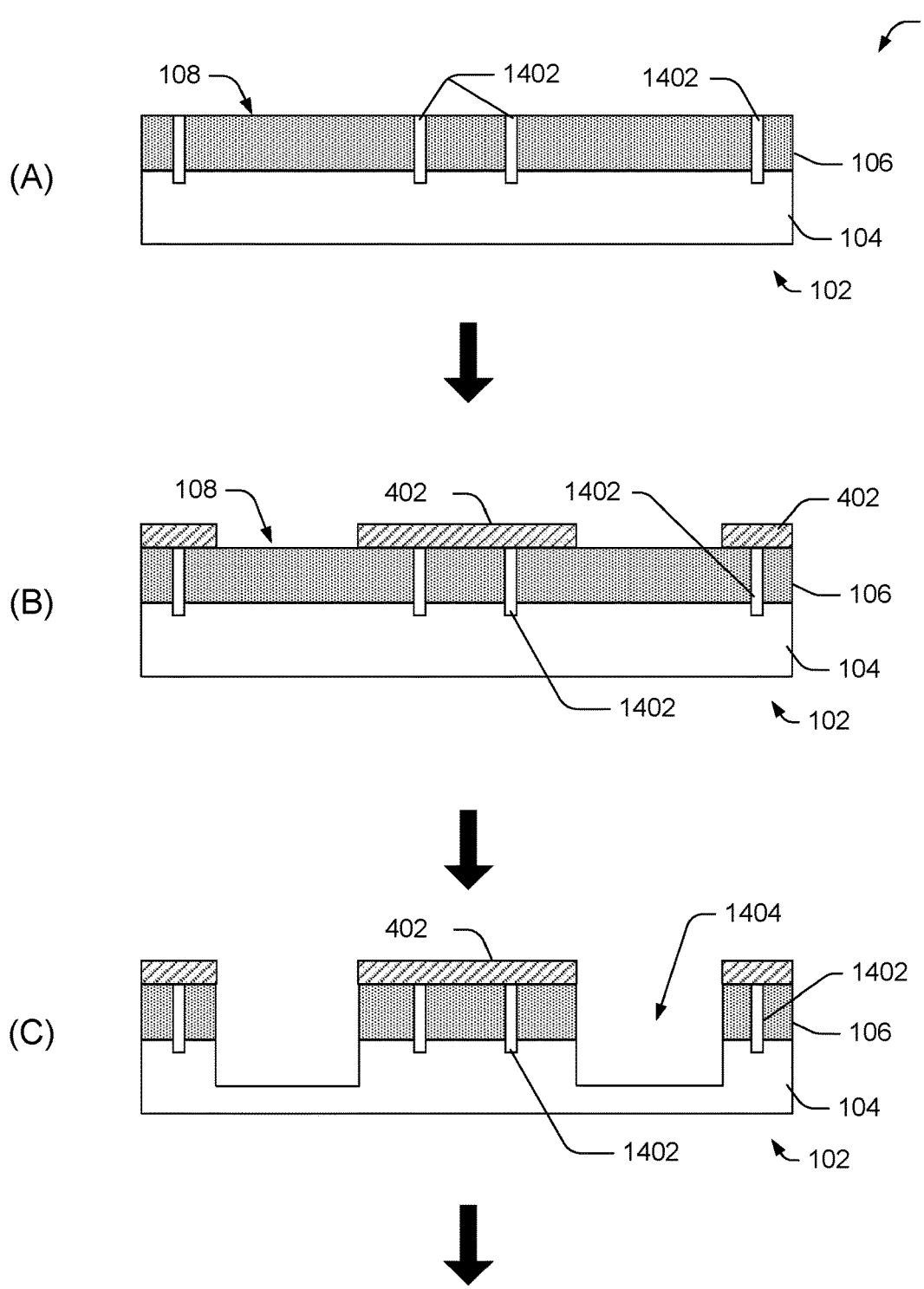
FIGS. 14 and 15 illustrate a graphical flow diagram showing an example process for forming a cavity with a seal ring or contact hybrid bonding surface, according to an embodiment.

Referring to FIG. 14, a process 1400 for forming a microelectronic assembly 1500 is shown. In various embodiments, the assembly 1500 is formed from a prepared die 102, having metallic seal rings 1402, disposed within the die 102 (e.g., embedded within the insulating layer 106, and extending into the base substrate 104 in some cases) as desired. In some examples, the hermeticity of the finished assembly 1500 can be based on the dimensions of the seal rings 1402.

The die 102 is prepared as described in processes 100 or 200, for example, using a Damascene process (or the like) to form the seal rings 1402. The assembly 1500 also includes one or more cavities 1404 that can be terminated inside the insulating layer 106, terminated at the interface of insulating layer 106 and the base layer 104, or extend through the insulating layer 106 and may extend at least partly through the base layer 104 of the die 102 as well. Accordingly, the assembly 1500 is well suited to applications with cavities, such as MEMS, sensors, and the like. The assembly 1500 may be formed and prepared for direct bonding to another die, wafer, substrate, or the like, or another assembly, such as another assembly 1500 as described herein.

At block A, the process 1400 includes planarizing the hybrid bonding surface 108 of the first die 102 as desired, using a CMP process for example. At block B, the process 1400 includes forming a patterned resist layer 402 over the bonding surface 108 of the first die 102, with patterned gaps in the resist layer 402 aligned over a portion of the insulating layer 104 corresponding to locations for cavities 1404 to be formed. For instance, the cavities 1404 may be formed inside the perimeter of the seal rings 1402.

At block C, the process 1400 includes etching the materials (e.g., oxide, silicon, etc.) of the insulating layer 106 (partially or completely) and optionally partially into the base layer 104 of the die 102 to a desired depth to form one or more cavities 1404.

Figure 15:
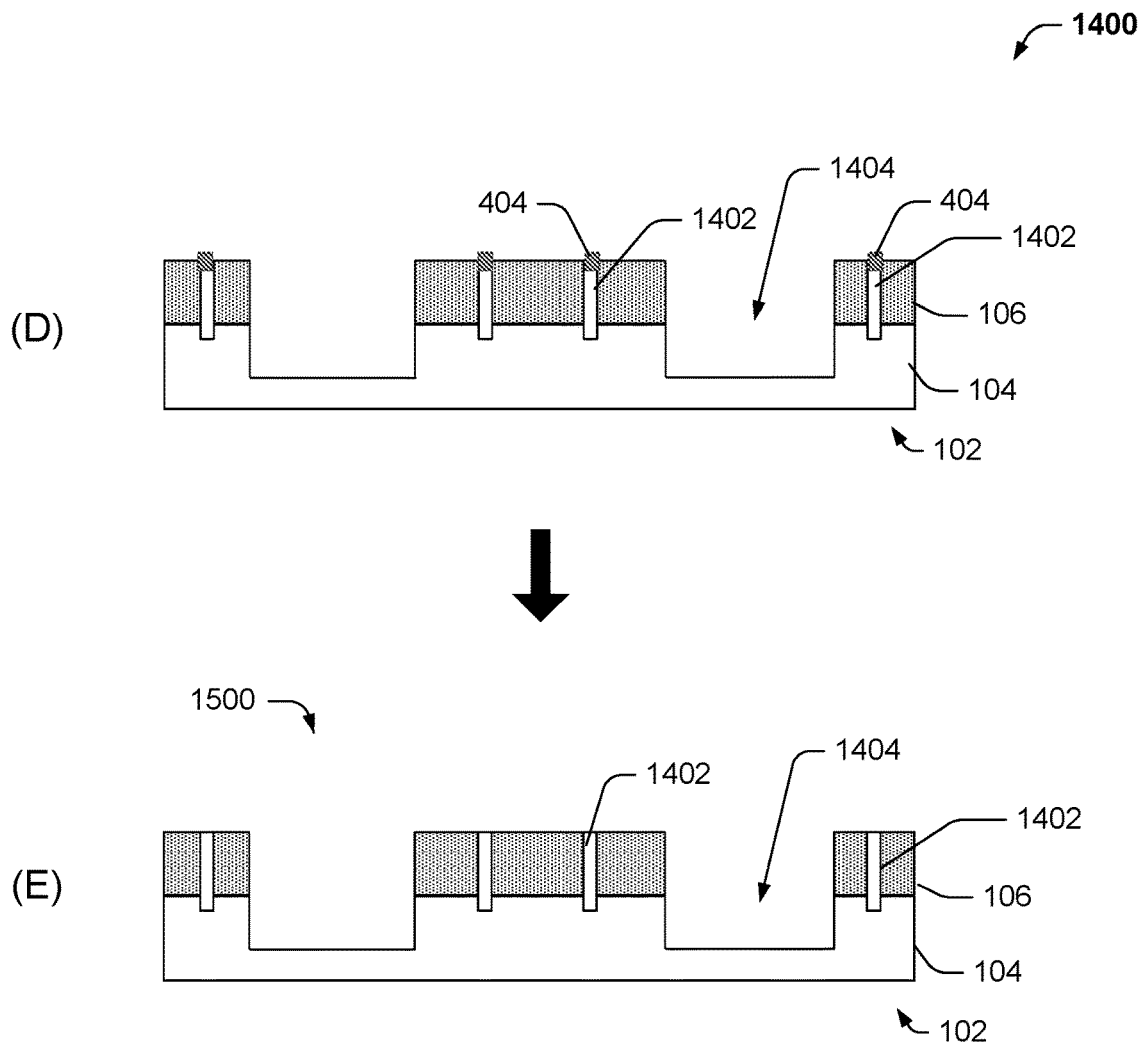

Referring to FIG. 15, at block D, the process 1400 includes removing the resist 402 from the bonding surface 108. The resist 402 may be removed using a wet strip followed by oxygen plasma ashing, for example. In some cases, the resist 402 removal steps may cause the surfaces of the seal rings 1402 to oxidize (forming copper oxide 404, for example). Depending on the amount of oxidation 404, the surfaces of the seal rings 1402 may protrude above the bonding surface 108, as shown in FIG. 15.

At block E, the process 1400 includes removing the oxidation 404 from the seal rings 1402 using a CMP process and/or a wet etch process as described above, while controlling the removal rate of material on the seal rings 1402. For example, selective etching techniques are used to remove the oxidation 404, which may include etching the oxide 404 with a dilute formulary, such as a 1:20 ratio of sulfuric acid and water, a touch-up CMP with a slurry formulated for polishing a barrier layer, or the like. A specified recess for the seal rings 1402 (if applicable) may be achieved as part of the oxidation 404 removal step with controlled material removal.

In some cases, electrochemical enhancement of etching on some seal rings 1402 may be experienced, due to bimetal effects and photovoltaic effects, for example. In these cases, approximately 10-200 nm of oxide and/or barrier metal can be deposited over the bonding surface 108. CMP (or the like), with a barrier layer slurry, for example, can be used to touch polish and re-expose the seal rings 1402 on the bonding surface 108. Care must be taken to avoid rounding the edges (e.g., eroding) of the insulating layer 106 as it meets the seal rings 1402. The result of the process 1400 is the microelectronic element 1500, as shown, which is ready for direct bonding.

Figure 16:
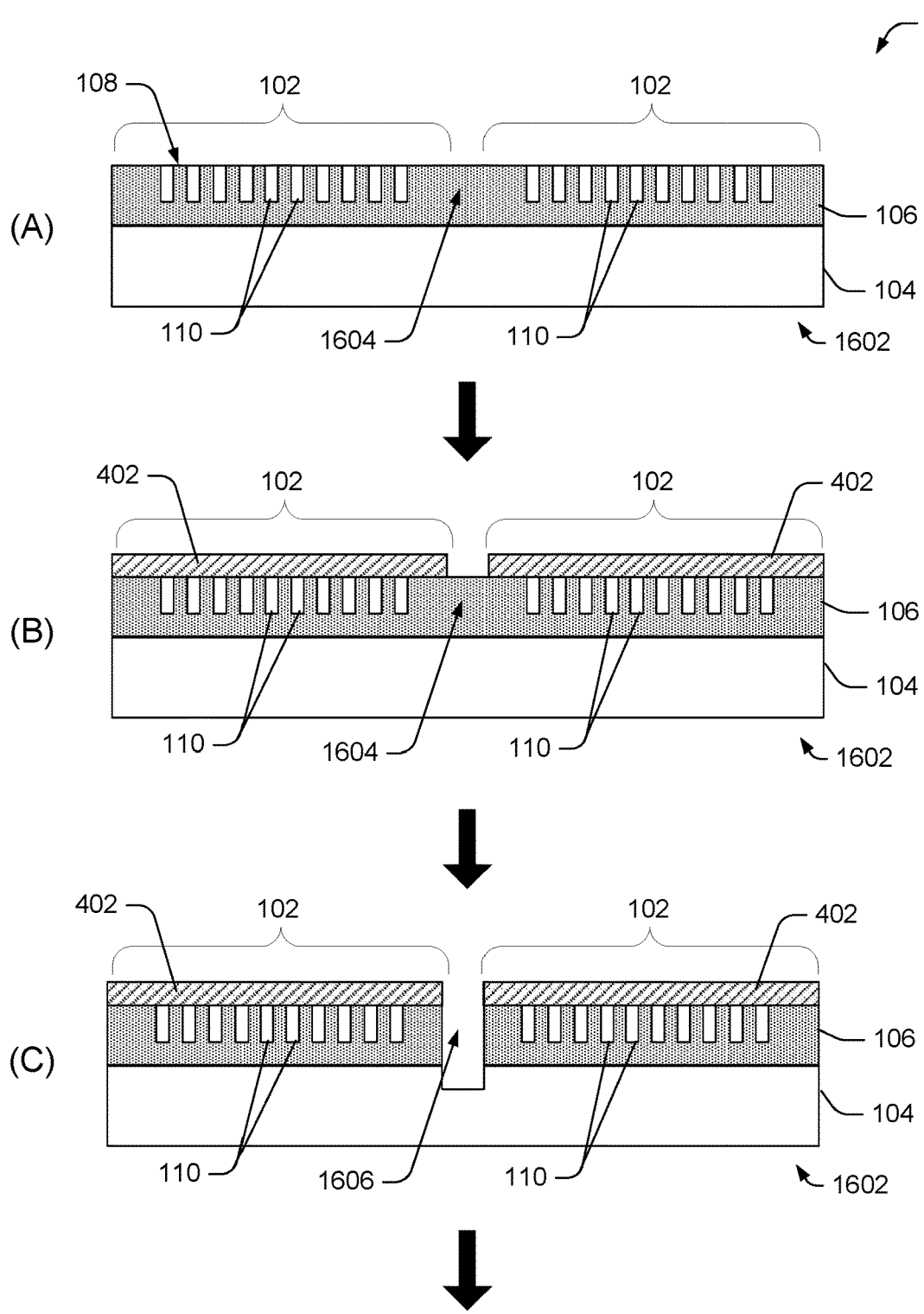
FIGS. 16 and 17 illustrate a graphical flow diagram showing an example process for street etching a wafer prior to singulation, according to an embodiment.
Figure 17:
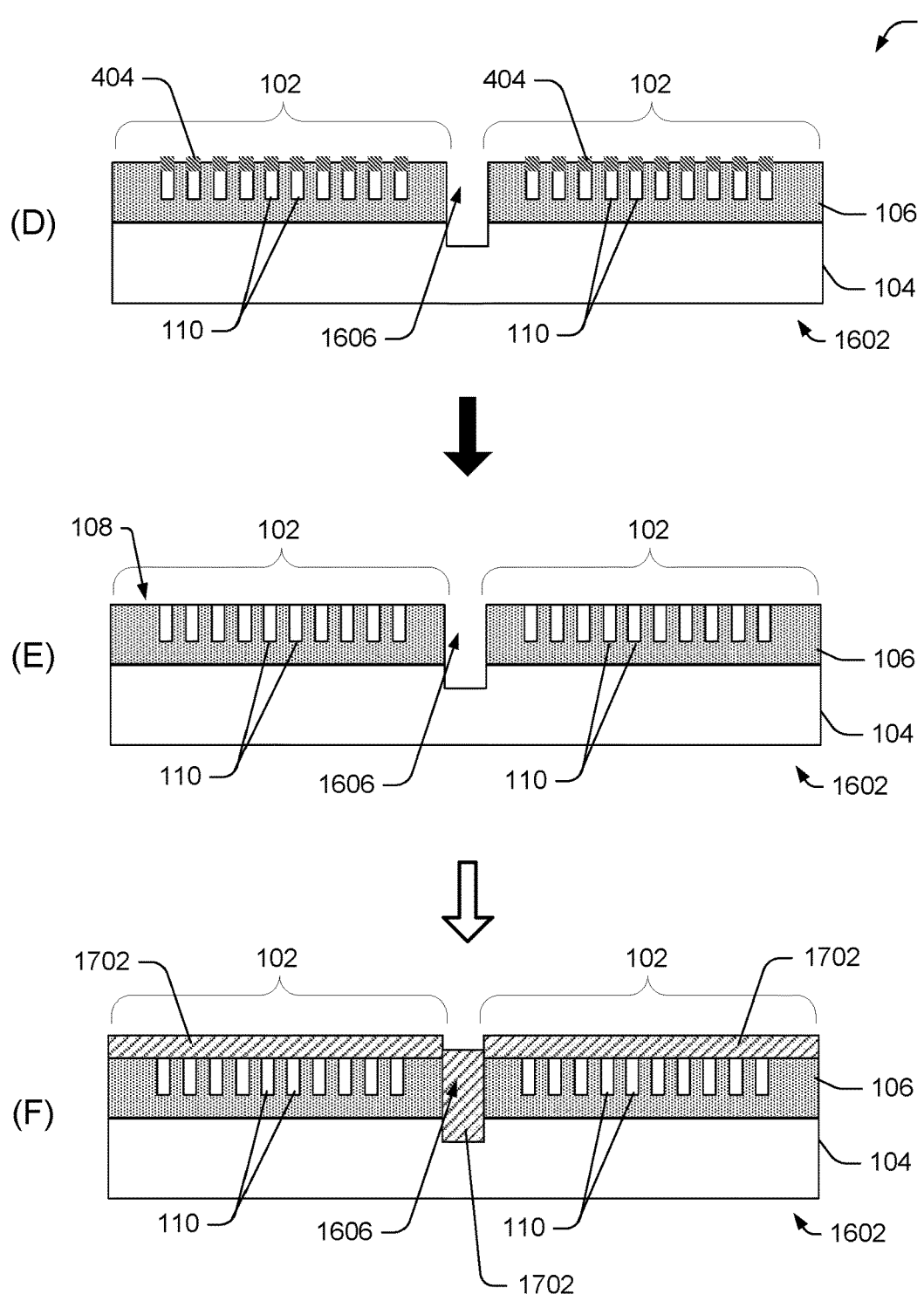

Referring to FIGS. 16 and 17, a process 1600 for street etching prior to die 102 singulation is shown. In various embodiments, a wafer 1602 can be formed and prepared as described in processes 100 or 200, for example, using a Damascene process (or the like) to form one or more conductive features 110 (or seal rings 1402, etc.). At block A, the process 1600 includes planarizing the hybrid bonding surface 108 as desired, using a CMP process for example. At block B, the process 1600 includes forming a patterned resist layer 402 over the bonding surface 108 of the dies 102 of the wafer 1602, with patterned gaps in the resist layer 402 aligned over a portion of the insulating layer 106 corresponding to a dicing street 1604 for die 102 singulation. For instance, the dicing street 1604 is disposed between formed dies 102 of the wafer 1602.

At block C, the process 1600 includes etching the materials (e.g., oxide, silicon, etc.) of the insulating layer 104 and the base layer 104 of the die 102 to a desired depth to form the dicing street 1604 channel or recess 1606.

Referring to FIG. 17, at block D, the process 1600 includes removing the resist 402 from the bonding surface 108. The resist 402 may be removed using a wet strip followed by oxygen plasma ashing, for example. In some cases, the resist 402 removal steps may cause the surfaces of the conductive features 110 (or seal rings 1402, for example) to oxidize (forming copper oxide 404, for example). Depending on the amount of oxidation 404, the surfaces of the conductive features 110 may protrude above the bonding surface 108, as shown in FIG. 17.

At block E, the process 1600 includes removing the oxidation 404 from the conductive features 110 using a CMP process and/or a wet etch process as described above, while controlling the removal rate of material on the conductive features 110. For example, selective etching techniques are used to remove the oxidation 404, which may include etching the oxide 404 with a dilute formulary, such as a 1:20 ratio of sulfuric acid and water, or by light CMP with a slurry formulated for polishing a barrier layer, or the like. A specified recess for the conductive features 110 (if applicable) may be achieved as part of the oxidation 404 removal step with controlled material removal.

In some cases, electrochemical enhancement of etching on some conductive features 110 may be experienced, due to bimetal effects and photovoltaic effects, for example. In these cases, approximately 10 nm-200 nm of oxide and/or barrier metal can be deposited over the bonding surface 108. CMP (or the like), with a barrier layer slurry, for example, can be used to touch polish and re-expose the conductive features 110 on the bonding surface 108. Care must be taken to avoid rounding the edges (e.g., eroding) of the insulating layer 106 as it meets the conductive features 110.

At block F, as an option, a protective coating 1702 may be applied to the bonding surface, as well as within the dicing street recess 1606, if desired. The protective coating can protect the bonding surface 108 during singulation into individual dies 102, the singulation occurring within the dicing street recess 1606.

In various embodiments, wafers (such as wafers 1602), dies (such as dies 102 and 302), and other substrates and so forth having a hybrid bonding surface 108 may be touch polished after long-term storage results in some oxidation of metallic features, such as conductive features 110, seal rings 1402, and the like. The touch polish may include using a CMP process and/or a wet etch process as described above, while controlling the removal rate of material on the metallic features. For example, selective etching techniques are used to remove the oxidation, which may include etching the oxide with a dilute formulary, such as a 1:20 ratio of sulfuric acid and water, touch polish with a slurry formulated for polishing a barrier layer, or the like. A specified recess for the metallic features (if applicable) may be restored as part of the oxidation removal step with controlled material removal.

In some cases, electrochemical enhancement of etching on some metallic features may be experienced, due to bimetal effects and photovoltaic effects, for example. In these cases, approximately 10 nm-200 nm of oxide and/or barrier metal can be deposited over the bonding surface 108. CMP (or the like), with a barrier layer slurry, for example, can be used to touch polish and re-expose the metallic features on the bonding surface 108. Care must be taken to avoid rounding the edges (e.g., eroding) of the insulating layer 106 as it meets the metallic features. After touch polishing, the wafers, dies, substrates, etc. are prepared for direct bonding.

Additional Example Assemblies

Referring to FIGS. 18-32, in various embodiments, various microelectronic assemblies may be formed, based on or related to the assemblies 300, 600, 1200, 1302, 1500, and so forth. In other words, the various microelectronic assemblies comprise assemblies of two or more direct bonded dies 102 and/or 302, wafers 1602, substrates, and the like, in various combinations.

Figure 18:
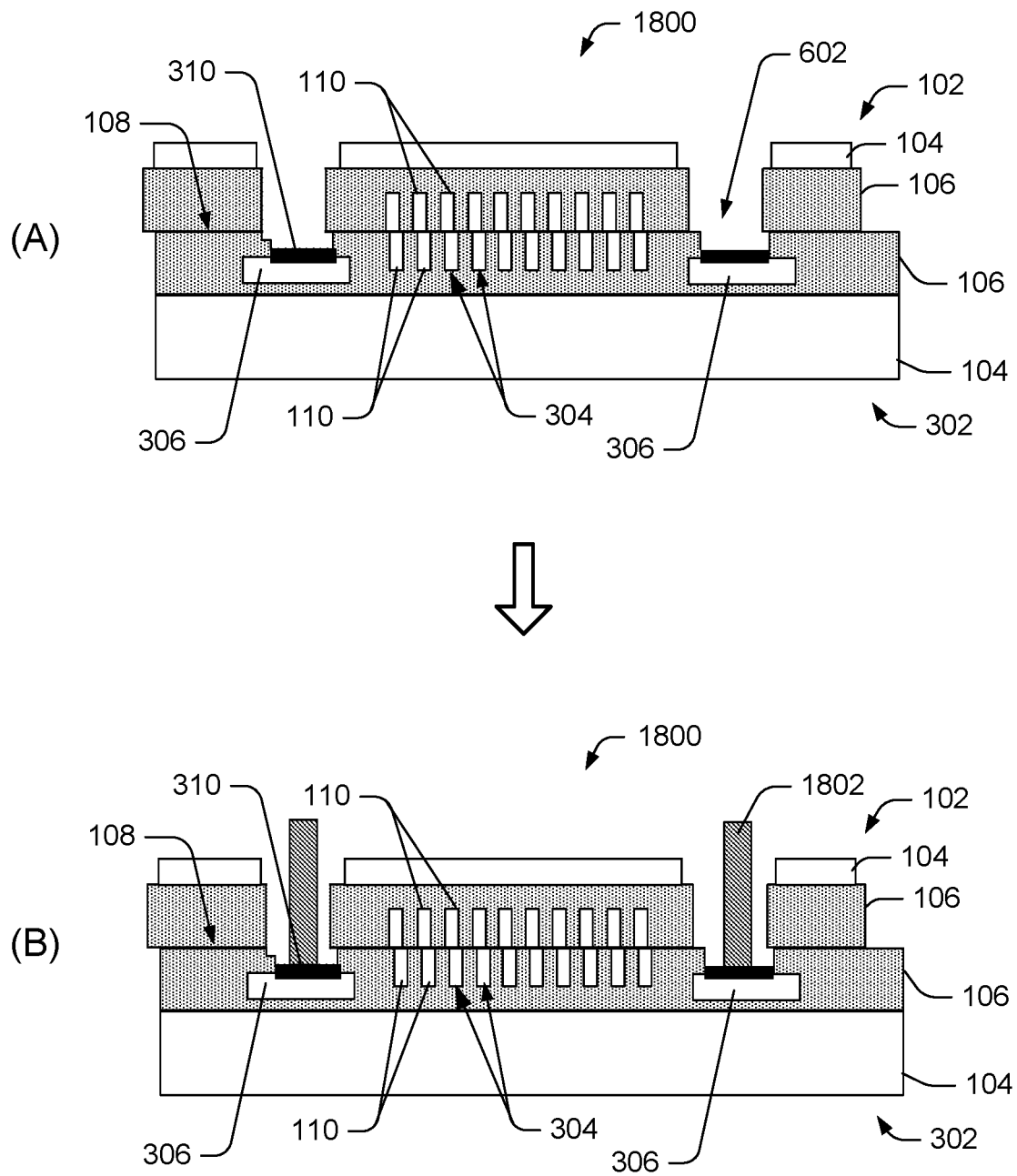
FIGS. 18-23 show examples of assemblies formed from stacked and bonded devices, having hybrid bonding pads and peripheral pads, according to various embodiments.

Referring to FIG. 18, at block A, a microelectronic assembly 1800 is shown, comprising an assembly 600 with one or more contact pads 306 that are disposed inside of the die 102 perimeter. The assembly 1800 includes openings etched through the base layer 104 of the die 102 to reveal the contact pads 306 in the second die 302 and the cavities 602, as shown in FIG. 12, block E.

As shown in FIG. 18, in some cases, the first 102 and second 302 dies (and the respective conductive features 110) may be substantially aligned, or they may be slightly misaligned, but within hybrid bonding tolerances. The openings 702 and 308 in the first 102 and second 302 dies may also be somewhat misaligned, but still form the cavity 602 and still provide sufficient access to the contact pads 306.

Optionally, as shown in block B, one or more conductive interconnect structures 1802 may be electrically coupled to the contact pads 306, to provide electrical access to the contact pads 306 from the top of the assembly 1800. For instance, the conductive interconnect structures 1802 may protrude above the top of the base layer 104 of the die 102 in some cases.

Figure 19:
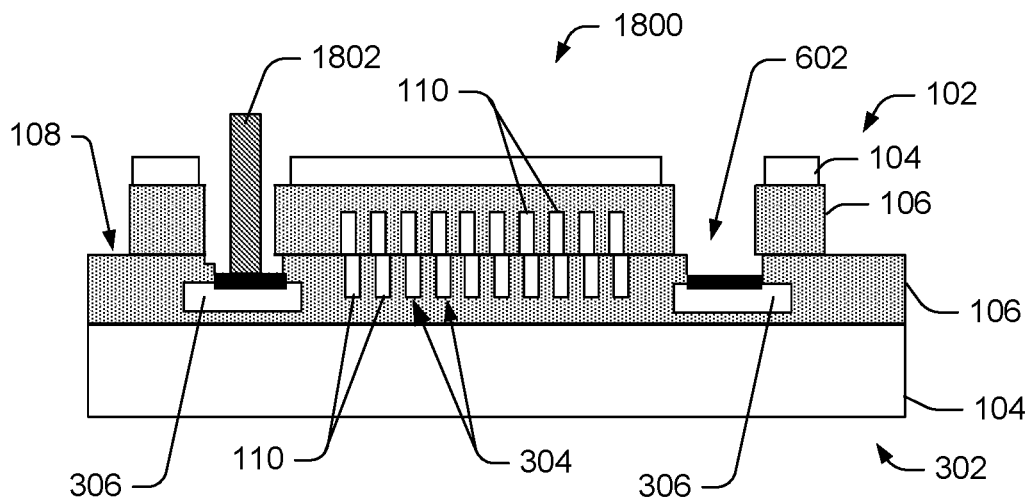

In an embodiment, as shown at FIG. 19, the first die 102 of the assembly 1800 may have a smaller footprint than the second die 302. In another embodiment, as also shown at FIG. 19, not all of the cavities 602 may include a conductive interconnect structure 1802. Access to the contact pad 306 may be from inside the cavity 602, or the like.

Figure 20:
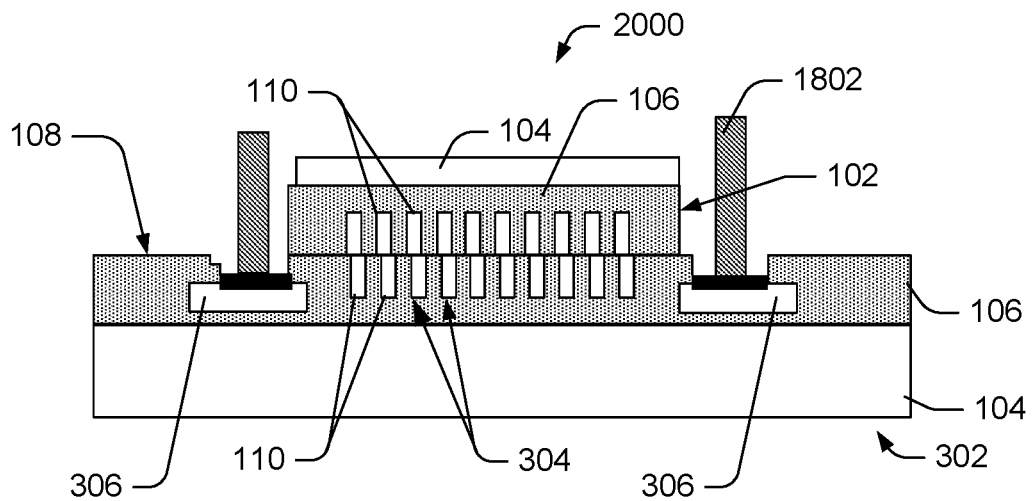

In an embodiment, as shown at FIG. 20, a microelectronic assembly 2000 may comprise an assembly 300 where the first die 102 of the assembly 2000 has a smaller footprint than the second die 302, and where the non-hybrid contact pads 306 of the second die 302 are disposed outside of the perimeter of the first die 102. In an alternate implementation, the assembly 200 includes one or more conductive interconnect structures 1802 electrically coupled to the contact pads 306, to provide electrical access to the contact pads 306 from the top of the assembly 2000.

Figure 21:
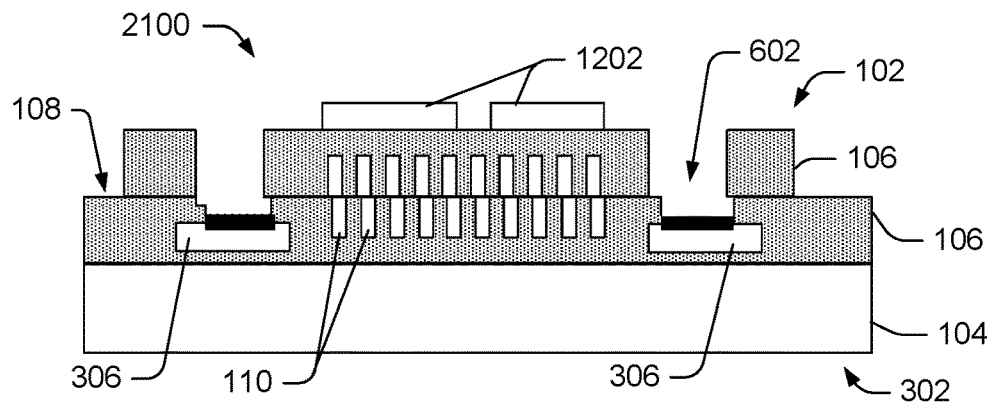

In an embodiment, as shown at FIG. 21, a microelectronic assembly 2100 may comprise an assembly 1200 where the first die 102 of the assembly 2000 has a smaller, larger, or substantially same size footprint than the second die 302, and where the non-hybrid peripheral contact pads 306 of the second die 302 are disposed inside of the perimeter of the first die 102. Further, the first die 102 includes islands 1202 formed by etching off the top base layer 104 of the die 102 in non-active areas of the die 102. For instance, active base material (e.g., silicon) islands 1202 may be left on the top surface of the die 102 in active areas of the die 102. In some embodiments, the base material islands 1202 may be electrically insulated and/or EMI shielded, or the like. In the case of an image sensor, laser, light emitting diode (LED), etc., an anti-reflection coating may be applied to the islands 1202.

Figure 22:
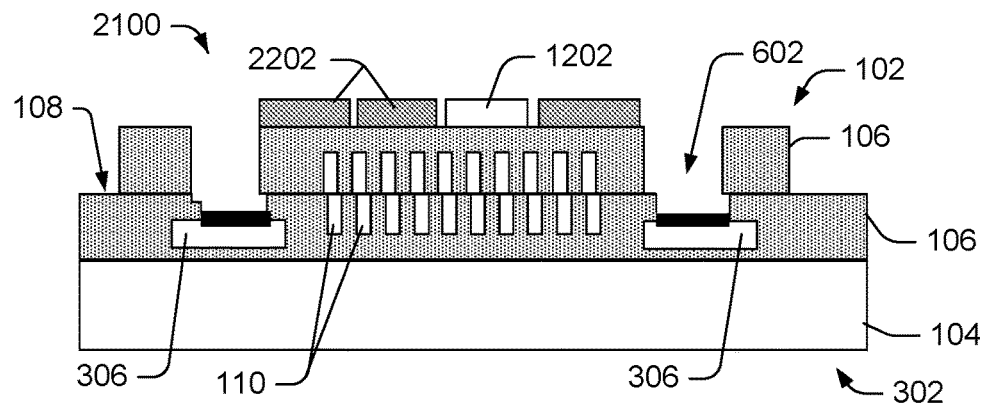

In an alternate embodiment, as shown at FIG. 22, the assembly 2100 includes at least one metal layer 2202 on the exposed insulating layer 106 of the first die 102. In various examples, the metal layers 2202 can provide EMI protection, heat dissipation, or other functions as desired.

Figure 23:
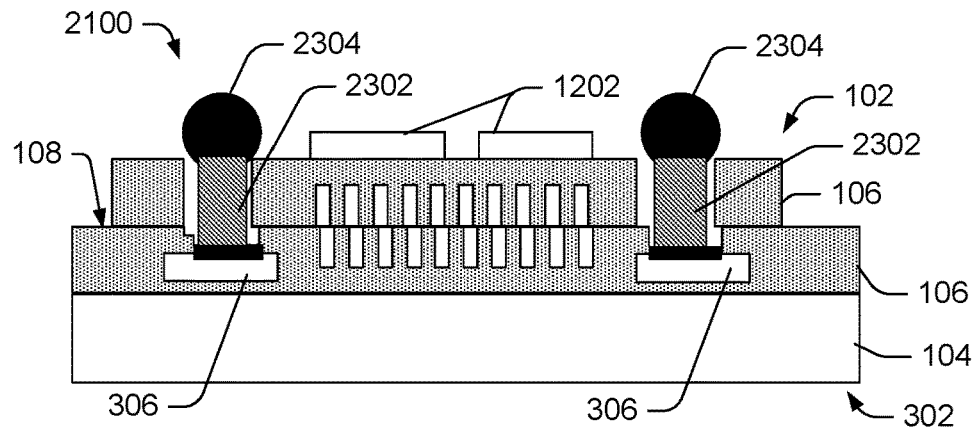

In another alternate embodiment, as shown at FIG. 23, the assembly 2100 may include deposited metal 2302 in one or more of the cavities 602, electrically coupled to the contact pads 306 for interconnection to the pads 306. For instance, in some cases, a terminal 2304 (such as a solder ball, or the like) may be coupled to the deposited metal 2302 for convenience in making the desired interconnections.

Figure 24:
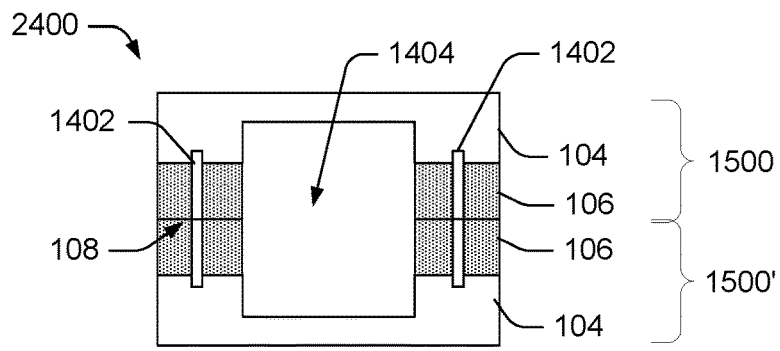
FIGS. 24-26 show examples of assemblies formed from stacked and bonded devices, having interior cavities and seal rings, according to various embodiments.
Figure 25:
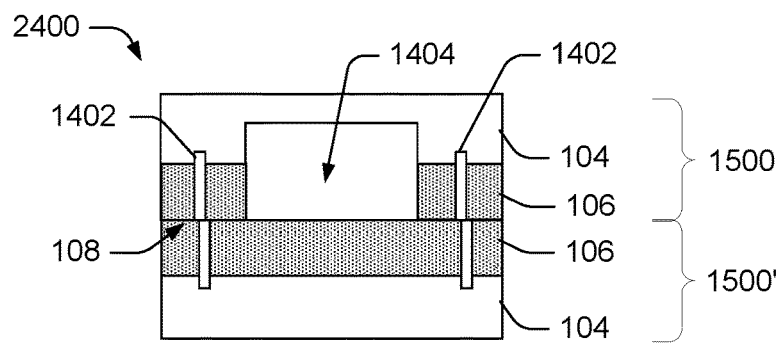
Figure 26:
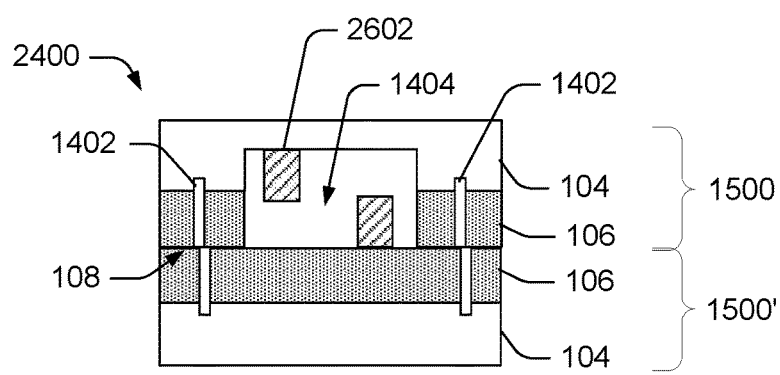

Referring to FIGS. 24-26, direct bonded assemblies 2400 with cavities 1404 and seal rings 1402 are shown. In various implementations, the assemblies 2400 are formed of at least a pair of assemblies 1500, directly bonded without adhesive (e.g., hybrid bond). In an embodiment as shown in FIG. 24, the cavity 1404 of each of the assemblies 1500 is etched through the insulating layer 106 and partly through the base layer 104. In various alternate embodiments, the cavity 1404 may be more or less etched into one of the assemblies 1500 than the other assembly 1500'. See below for some example etch depth options.

In one example, as shown in FIG. 25, the cavity 1404 is etched into the first assembly 1500, and not etched into the second assembly 1500'. The example etch depth shown in the drawing of FIG. 25 is through the insulating layer 106 and partially into the base layer 104. Alternatively, the etch depth may be partially through the insulating layer 106 only, or through the insulating layer 106 but not into the base layer 104, In alternate embodiments, the cavity 1404 may be etched into the second assembly 1500' and not into the first assembly 1500 (see above for example etch depth options). Further, as shown in FIG. 26, an assembly 2400 may include one or more components 2602 (e.g., components, structures, circuits, elements, etc.) mounted inside the cavity 1404. Since the assembly 2400 includes seal rings 1402, the cavity 1404 can be hermetically sealed, providing an ideal environment for various sensors, MEMS, or the like.

Figure 27:
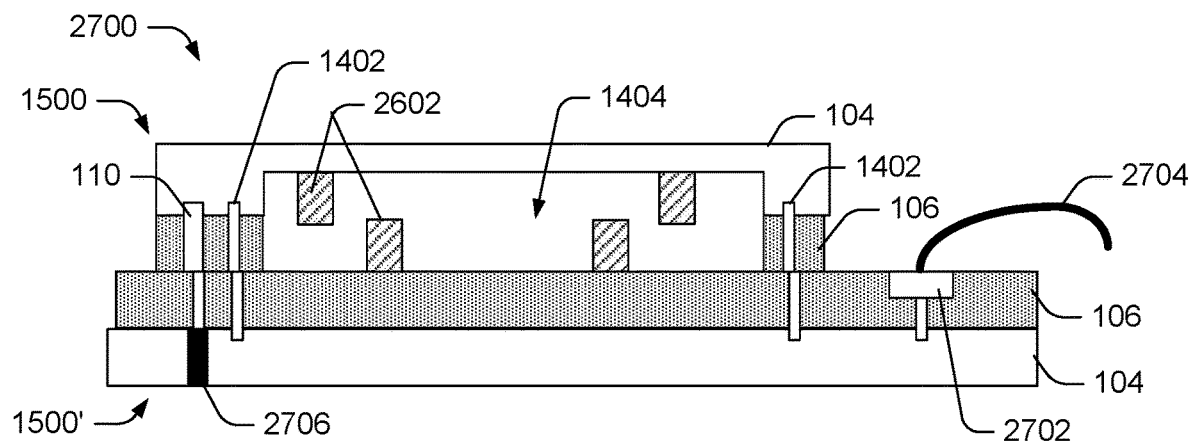
FIG. 27 shows an example of an assembly formed from stacked and bonded devices, having hybrid bonding pads and seal rings, and at least one peripheral pad outside the die perimeter, according to an embodiment.
Figure 28:
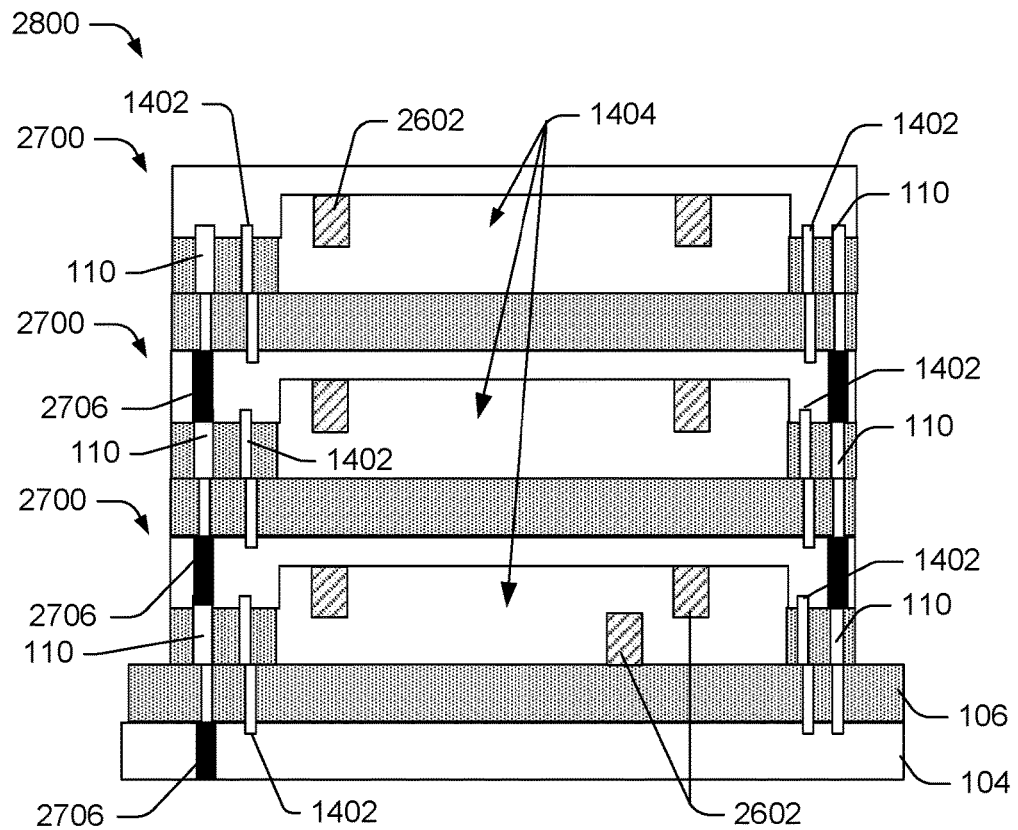
FIG. 28 shows an example of an assembly formed from multiple stacked and bonded devices, having hybrid bonding pads and seal rings, according to an embodiment.

Referring to FIGS. 27-28, in another embodiment, an assembly 2700 comprises an assembly 2400 where the second assembly 1500' has a footprint that is larger than a footprint of the first assembly 1500. In an example, the second assembly 1500' includes a peripheral bond pad 2702 outside the perimeter of the first assembly 155, which may be used for wirebond 2704, or like electrical connections. The cavity 1404 of the assembly may include one or more components 2602, and the cavity 1404 may be hermetically sealed, due to the presence of seal rings 1402. Also, the assembly 2700 may include one or more conductive features 110 for electrical interconnection within the assembly 2700, and to outside components, for example using a through-silicon via (e.g., TSV) 2706, or the like.

As shown in FIG. 28, a plurality of assemblies 2700 may be stacked to form an assembly 2800. Alternately, as shown, at least one or more of the plurality of assemblies 2700 may not include a base layer 104 on one of the assemblies 1500 and/or 1500'. As shown, the assemblies may include seal rings 1402 as well as conductive features 110 (these arranged to electrically couple the assemblies 2700 together, with or without vias 2706).

Figure 29:
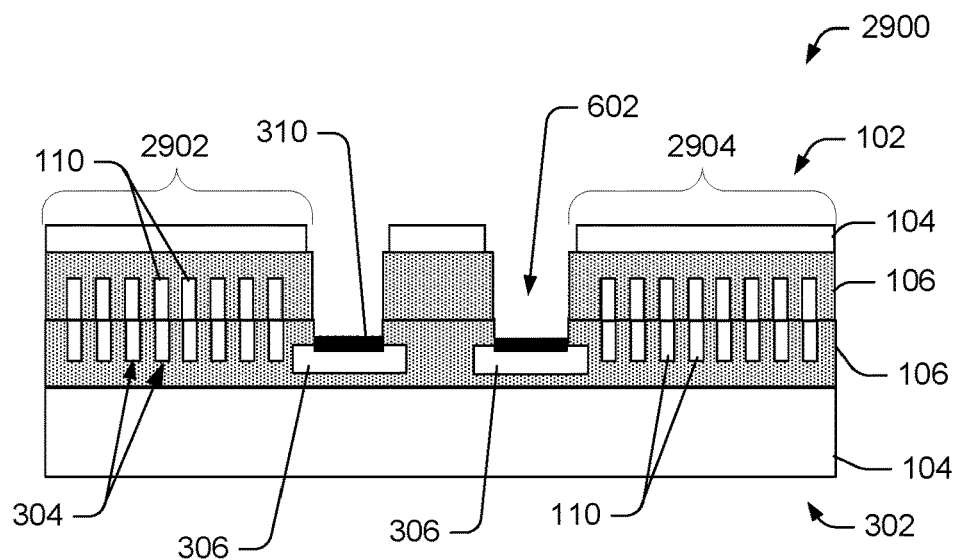
FIGS. 29-32 show example stacked and bonded microelectronic assemblies having etched openings through layers of the microelectronic assemblies, according to various embodiments.
Figure 30:
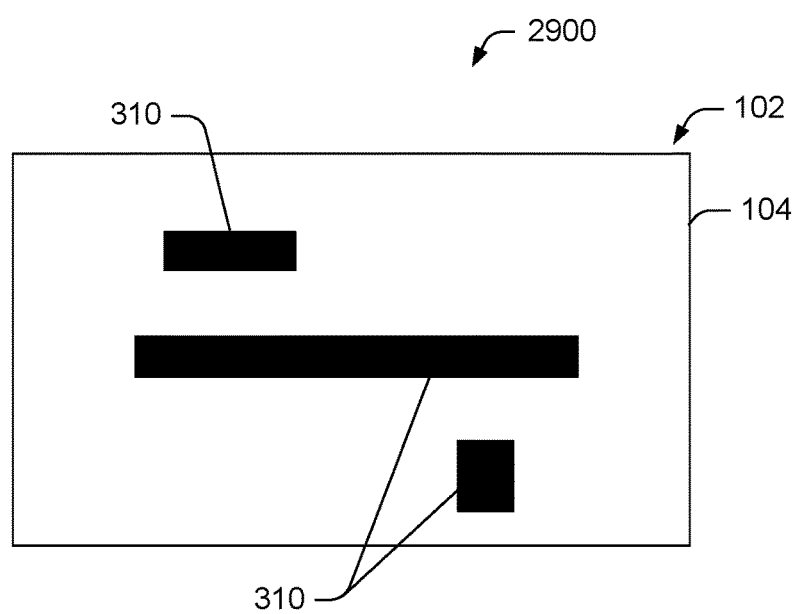
Figure 31:
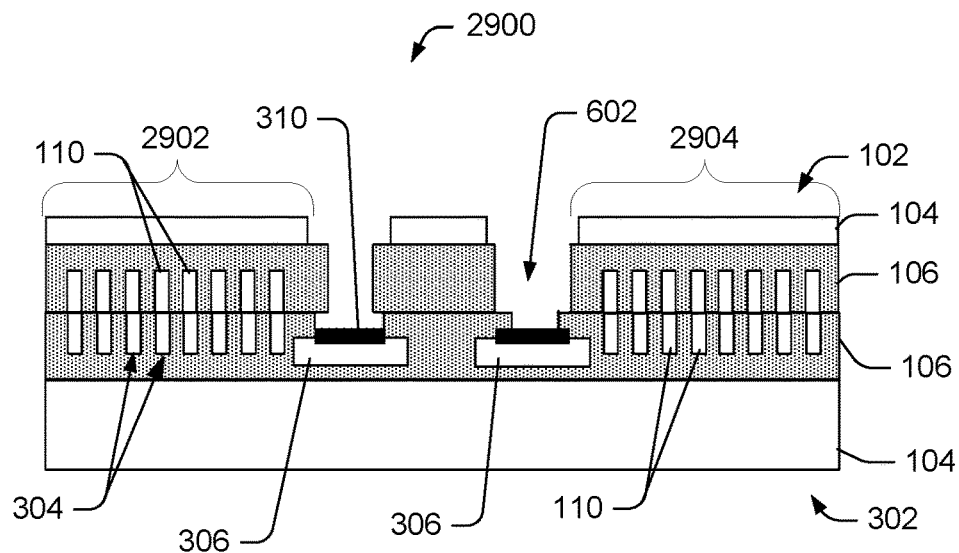

Referring to FIGS. 29-32, a microelectronic assembly 2900 is shown, comprising an assembly 500 with one or more contact pads 306 that are disposed inside of the die 102 perimeter. For instance, at FIGS. 29 and 31 show a microelectronic assembly 2900 with the contact pads 306 disposed between two active areas (2902 and 2904) of the assembly 2900. Thus, the contact pads 306 may be disposed at preselected areas that are not necessarily at the periphery of the dies 102 and 302. For instance, the contact pads 306 may be disposed within a perimeter of the active area of a die 102 and 302. The assembly 2900 includes openings etched through the base layer 104 and the insulating layer 106 of the die 102, as well as the insulating layer 106 of the die 302 to reveal the cavities 602 and the contact pads 306 in the second die 302.

FIG. 30 illustrates a top-down view of an assembly 2900, or the like, showing that the contact pads 306 may be in the form of conductive strips, or other shaped structures. For example, stacked Dynamic Random Access Memory (DRAM) assemblies often have TSVs in a center strip (or like locations) of the die 302. This arrangement may be used with other assemblies as well.

Figure 32:
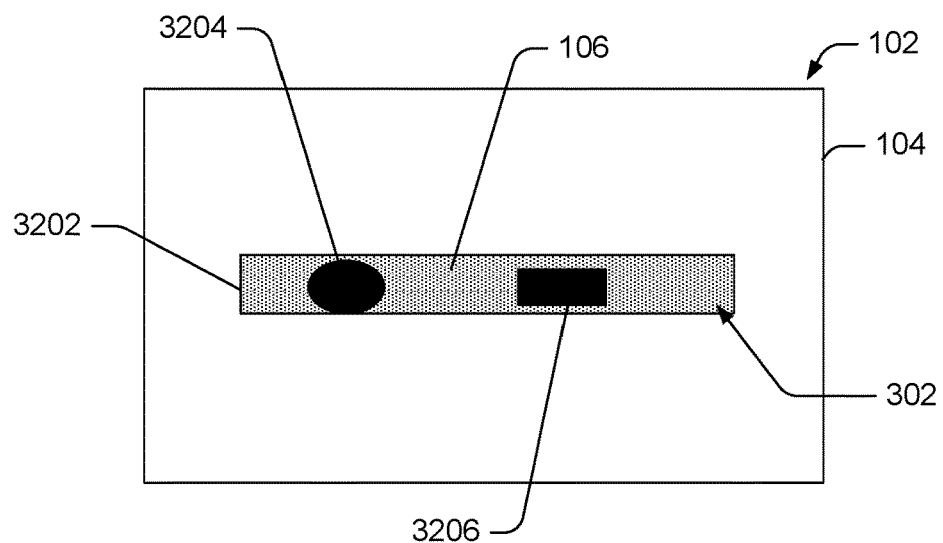
Figure 33:
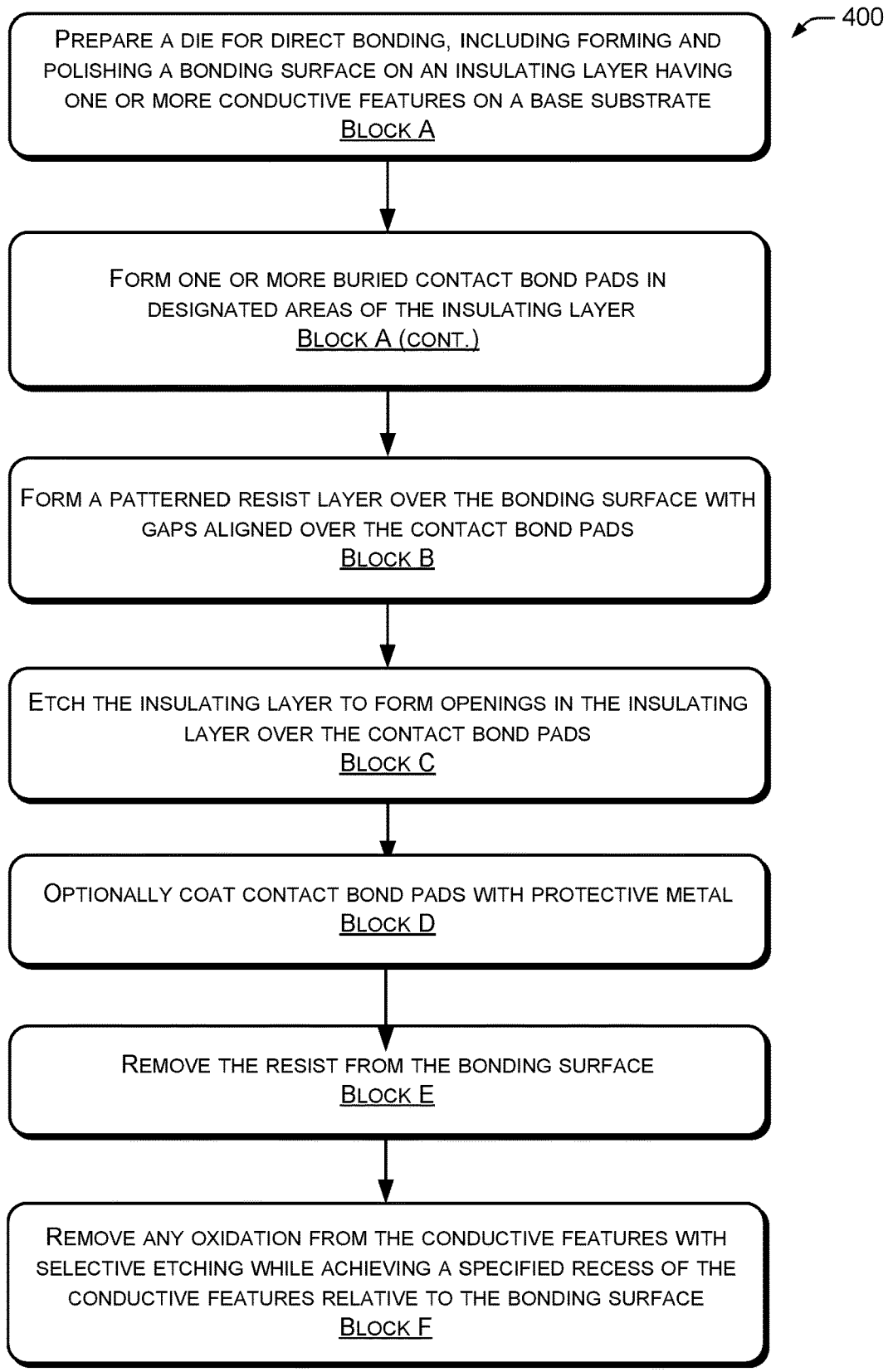
FIG. 33 is a flow diagram illustrating an example process for preparing dies for bonding, according to an embodiment.

As shown at FIG. 31, the etched openings in the base layer 104 and insulating layer 106 of the first die 102 and the insulating layer 106 of the second die 302 that form the cavities 602 for access to the contact pads 306 need not be perfectly aligned. Additionally, as shown at FIG. 32, the etched openings in the base layer 104 and insulating layer 106 of the first die 102 and the insulating layer 106 of the second die 302 may have different sizes, shapes, footprints, and so forth. For instance, as shown at FIG. 32, the opening 3202 in the base layer 104 of the first die 102 may comprise a first shape (e.g., a rectangle, for this example, but may comprise any geometric or irregular shape) that exposes the insulating layer(s) 106 of the first 102 and/or second dies 302. Additionally, the openings 3204 and 3206 in the insulating layers 106 of the first 102 and second dies 302 may comprise a same or different shape (e.g., an ellipse and a rectangle, respectively, in this example, but may comprise any geometric or irregular shape) that exposes the contact pads 306 of the second die 302.

In various embodiments, some process steps may be modified or eliminated, in comparison to the process steps described herein.

The techniques, components, and devices described herein are not limited to the illustrations of FIGS. 1-28, and may be applied to other designs, types, arrangements, and constructions including with other electrical components without departing from the scope of the disclosure. In some cases, additional or alternative components, techniques, sequences, or processes may be used to implement the techniques described herein. Further, the components and/or techniques may be arranged and/or combined in various combinations, while resulting in similar or approximately identical results.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A microelectronic assembly, comprising:
a first substrate having a bonding surface, the bonding surface of the first substrate having a planarized topography;
a first plurality of electrically conductive features at the bonding surface of the first substrate;
a second substrate having a bonding surface, the bonding surface of the second substrate having a planarized topography and direct hybrid bonded to the bonding surface of the first substrate;
a second plurality of electrically conductive features at the bonding surface of the second substrate bonded to the first plurality of electrically conductive features while misaligned to the first plurality of electrically conductive features by a first extent, wherein the first and second plurality of electrically conductive features together define a footprint perimeter;
one or more electrically conductive contact pads disposed within an insulating layer of the second substrate and below the bonding surface of the second substrate, the one or more electrically conductive contact pads disposed inside the footprint perimeter;
one or more secondary openings in the insulating layer of the second substrate aligned to the one or more electrically conductive contact pads, the one or more secondary openings extending from the bonding surface of the second substrate to the one or more electrically conductive contact pads; and
one or more primary openings in an insulating layer of the first substrate, misaligned to the one or more secondary openings by the first extent, the one or more primary openings extending to the one or more secondary openings and providing electrical access to the one or more electrically conductive contact pads.

2. The microelectronic assembly of claim 1, further comprising one or more tertiary openings in a base layer of the first substrate, aligned to the one or more primary openings in the insulating layer of the first substrate, the one or more tertiary openings extending from an outside surface of the first substrate to the one or more primary openings, providing electrical access to the one or more electrically conductive contact pads from beyond the outside surface of the first substrate.

3. The microelectronic assembly of claim 2, further comprising one or more electrically conductive structures disposed within one or more of the one or more secondary openings, the one or more primary openings, and the one or more tertiary openings, and electrically coupled to the one or more electrically conductive contact pads.

4. The microelectronic assembly of claim 1, wherein a footprint of the first substrate is smaller than a footprint of the second substrate.

5. A microelectronic assembly, comprising:
a first substrate in a first component, the first component having a bonding surface with a planarized topography;
a first plurality of electrically conductive features at the bonding surface of the first component;
a second substrate in a second component, the second component having a bonding surface, wherein the bonding surface of the second component has a planarized topography and is direct hybrid bonded to the bonding surface of the first component;
a second plurality of electrically conductive features at the bonding surface of the second component and bonded to the first plurality of electrically conductive features;
one or more electrically conductive contact pads disposed within an insulating layer of the second component and below the bonding surface of the second component, the one or more electrically conductive contact pads disposed in an area different from the first plurality of electrically conductive features and the second plurality of electrically conductive features and outside a perimeter of the first substrate; and
one or more secondary openings in the insulating layer of the second component providing electrical access to the one or more electrically conductive contact pads.

6. The microelectronic assembly of claim 5, wherein the first substrate comprises a direct band gap semiconductor material.

7. The microelectronic assembly of claim 6, wherein the first substrate comprises gallium.

8. The microelectronic assembly of claim 7, wherein the second substrate comprises silicon.

9. The microelectronic assembly of claim 7, wherein the first substrate comprises arsenide.

10. The microelectronic assembly of claim 5, wherein the first substrate comprises a base semiconductor material that has been etched to leave at least one island in an active area of the first component.

11. The microelectronic assembly of claim 10, further comprising a metal layer overlying at least a portion of the first component on a side opposite the bonding surface of the first component.

12. A microelectronic assembly, comprising:
a first substrate in a first component, the first component having a bonding surface with a planarized topography;
a first plurality of electrically conductive features at the bonding surface of the first component;
a second substrate in a second component, the second component having a bonding surface, wherein the bonding surface of the second component has a planarized topography and direct hybrid bonded to the bonding surface of the first component;
a second plurality of electrically conductive features at the bonding surface of the second component and bonded to the first plurality of electrically conductive features;
one or more electrically conductive contact pads disposed within an insulating layer of the second component and below the bonding surface of the second component, the one or more electrically conductive contact pads disposed in an area different from the first plurality of electrically conductive features and the second plurality of electrically conductive features, wherein a footprint of the first substrate is smaller than a footprint of the second substrate; and
one or more secondary openings in the insulating layer of the second component providing electrical access to the one or more electrically conductive contact pads.

13. The microelectronic assembly of claim 12, wherein the first substrate comprises a base semiconductor material that has been etched to form at least one island in an active area of the first component, and wherein an insulating layer of the first component between the first substrate and the bonding surface of the first component extends laterally beyond the footprint of the first substrate.

14. The microelectronic assembly of claim 13, further comprising a metal layer overlying at least a portion of the first component on a side opposite the bonding surface of the first component.

15. The microelectronic assembly of claim 13, further comprising one or more primary openings in an insulating layer of the first component, aligned to the one or more secondary openings and to the electrically conductive contact pads, the one or more primary openings extending to the one or more secondary openings, providing electrical access to the one or more electrically conductive contact pads.

16. A microelectronic assembly, comprising:
  a first substrate having a bonding surface, the bonding surface of the first substrate having a planarized topography;
  a first plurality of electrically conductive features at the bonding surface of the first substrate;
  a second substrate having a bonding surface, the bonding surface of the second substrate having a planarized topography and direct hybrid bonded to the bonding surface of the first substrate;
  a second plurality of electrically conductive features at the bonding surface of the second substrate bonded to the first plurality of electrically conductive features while misaligned to the first plurality of electrically conductive features by a first extent, wherein the first and second plurality of electrically conductive features together define a footprint perimeter;
  one or more electrically conductive contact pads disposed within an insulating layer of the second substrate and below the bonding surface of the second substrate;
  one or more secondary openings in the insulating layer of the second substrate aligned to the one or more electrically conductive contact pads, the one or more secondary openings extending from the bonding surface of the second substrate to the one or more electrically conductive contact pads, wherein the secondary openings are laterally within the footprint perimeter; and
  one or more primary openings in an insulating layer of the first substrate, misaligned to the one or more secondary openings by the first extent, the one or more primary openings extending to the one or more secondary openings and providing electrical access to the one or more electrically conductive contact pads.

17. The microelectronic assembly of claim 16, further comprising one or more tertiary openings in a base layer of the first substrate, aligned to the one or more primary openings in the insulating layer of the first substrate, the one or more tertiary openings extending from an outside surface of the first substrate to the one or more primary openings, providing electrical access to the one or more electrically conductive contact pads from beyond the outside surface of the first substrate.

18. The microelectronic assembly of claim 17, further comprising one or more electrically conductive structures disposed within one or more of the one or more secondary openings, the one or more primary openings, and the one or more tertiary openings, and electrically coupled to the one or more electrically conductive contact pads.

19. The microelectronic assembly of claim 16, wherein a footprint of the first substrate is smaller than a footprint of the second substrate.

20. A microelectronic assembly, comprising:
  a first substrate having a bonding surface, the bonding surface of the first substrate having a planarized topography;
  a first plurality of electrically conductive features at the bonding surface of the first substrate;
  a second substrate having a bonding surface, the bonding surface of the second substrate having a planarized topography and direct hybrid bonded to the bonding surface of the first substrate;
  a second plurality of electrically conductive features at the bonding surface of the second substrate and bonded to the first plurality of electrically conductive features;
  one or more electrically conductive contact pads disposed within an insulating layer of the second substrate and below the bonding surface of the second substrate, the one or more electrically conductive contact pads disposed in an area different from the first plurality of electrically conductive features and the second plurality of electrically conductive features;
  one or more secondary openings in the insulating layer of the second substrate aligned to the one or more electrically conductive contact pads, the one or more secondary openings comprising cavities extending from the bonding surface of the second substrate to the one or more electrically conductive contact pads, providing electrical access to the one or more electrically conductive contact pads;
  at least one metal layer disposed on an outside surface of the first substrate, the metal layer configured for at least one of electromagnetic interference (EMI) protection and heat dissipation; and
  a base semiconductor island disposed on the outside surface of the first substrate,
  wherein the secondary openings are laterally within a perimeter of the first substrate and the first and second plurality of electrically conductive features are laterally outside of the secondary openings.

* * * * *